(12) United States Patent
Chen et al.

(10) Patent No.: US 10,734,337 B2
(45) Date of Patent: *Aug. 4, 2020

(54) SEMICONDUCTOR PACKAGE DEVICE HAVING GLASS TRANSITION TEMPERATURE GREATER THAN BINDING LAYER TEMPERATURE

(71) Applicant: Advanced Semiconductor Engineering, Inc., Kaohsiung (TW)

(72) Inventors: Kuang-Hsiung Chen, Kaohsiung (TW); Yu-Hsuan Tsai, Kaohsiung (TW); Yu-Ying Lee, Kaohsiung (TW); Sheng-Ming Wang, Kaohsiung (TW); Wun-Jheng Syu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/293,606

(22) Filed: Mar. 5, 2019

(65) Prior Publication Data

US 2019/0198469 A1    Jun. 27, 2019

Related U.S. Application Data

(63) Continuation of application No. 15/649,474, filed on Jul. 13, 2017, now Pat. No. 10,224,298.

(Continued)

(51) Int. Cl.
*H01L 23/28*    (2006.01)
*H01L 23/00*    (2006.01)
(Continued)

(52) U.S. Cl.
CPC ........... *H01L 24/02* (2013.01); *B81B 7/0006* (2013.01); *B81C 1/0023* (2013.01);
(Continued)

(58) Field of Classification Search
CPC . H01L 23/28; H01L 23/3114; H01L 23/4334; H01L 24/028; H01L 24/13;
(Continued)

(56) References Cited

U.S. PATENT DOCUMENTS 5,783,867 A    7/1998    Belke et al.
9,087,832 B2    7/2015    Huang et al.
(Continued)

FOREIGN PATENT DOCUMENTS

CN    1590498 A    3/2005
CN    101516993 A    8/2009
(Continued)

OTHER PUBLICATIONS

Non-Final Office Action in U.S. Appl. No. 15/649,474 dated Jun. 1, 2018.
(Continued)

*Primary Examiner* — Hoai V Pham
(74) *Attorney, Agent, or Firm* — Foley & Lardner LLP

(57) ABSTRACT

A micro-electromechanical systems (MEMS) package structure includes: (1) a circuit layer; (2) a MEMS die with an active surface, wherein the active surface faces the circuit layer; (3) a conductive pillar adjacent to the MEMS die; and (4) a package body encapsulating the MEMS die and the conductive pillar, and exposing a top surface of the conductive pillar.

16 Claims, 31 Drawing Sheets

Related U.S. Application Data

(60) Provisional application No. 62/383,094, filed on Sep. 2, 2016.

(51) Int. Cl.
| | |
|---|---|
| *B81C 1/00* | (2006.01) |
| *B81B 7/00* | (2006.01) |
| *H01L 21/56* | (2006.01) |
| *H01L 23/31* | (2006.01) |
| *H01L 25/065* | (2006.01) |
| *H01L 25/00* | (2006.01) |

(52) U.S. Cl.
CPC ........ *B81C 1/00333* (2013.01); *H01L 21/563* (2013.01); *H01L 23/3157* (2013.01); *H01L 24/11* (2013.01); *H01L 24/13* (2013.01); *H01L 25/0657* (2013.01); *H01L 25/50* (2013.01); *B81B 2207/012* (2013.01); *B81C 2203/0792* (2013.01); *H01L 2224/02373* (2013.01); *H01L 2224/11462* (2013.01); *H01L 2224/13018* (2013.01); *H01L 2224/81192* (2013.01)

(58) Field of Classification Search
CPC . H01L 2224/02373; H01L 2224/04105; H01L 2924/1461
See application file for complete search history.

(56) References Cited

U.S. PATENT DOCUMENTS

| | | | |
|---|---|---|---|
| 10,224,298 B2* | 3/2019 | Chen | .................... B81B 7/0006 |
| 2008/0128922 A1 | 6/2008 | Kotani et al. | |
| 2010/0032826 A1 | 2/2010 | Tachibana et al. | |
| 2014/0252647 A1 | 9/2014 | Huang et al. | |
| 2015/0257263 A1 | 9/2015 | Sethumadhavan et al. | |
| 2016/0300797 A1* | 10/2016 | Shim | .................. H01L 23/5389 |
| 2016/0368762 A1 | 12/2016 | Cheng et al. | |
| 2017/0338204 A1 | 11/2017 | Lee et al. | |

FOREIGN PATENT DOCUMENTS

| | | |
|---|---|---|
| CN | 102790018 A | 11/2012 |
| JP | 2000-500921 A | 1/2000 |
| WO | WO-2016/092973 A1 | 6/2016 |

OTHER PUBLICATIONS

Notice of Allowance in U.S. Appl. No. 15/649,474 dated Oct. 25, 2018.

Office Action and Search Report from corresponding Chinese Patent Application No. 201710713482.9, dated Aug. 14, 2019, 5 pages.

* cited by examiner

SEMICONDUCTOR PACKAGE DEVICE HAVING GLASS TRANSITION TEMPERATURE GREATER THAN BINDING LAYER TEMPERATURE

CROSS-REFERENCE TO RELATED APPLICATIONS

This application is a continuation of U.S. patent application Ser. No. 15/649,474, filed Jul. 13, 2017, which claims the benefit of and priority to U.S. Provisional Patent Application No. 62/383,094, filed Sep. 2, 2016, the contents of which are incorporated herein by reference in its entirety.

BACKGROUND

1. Technical Field

The present disclosure relates generally to a semiconductor package device and a method of manufacturing the same. More particularly, the present disclosure relates to a semiconductor package device including a micro-electromechanical systems (MEMS) structure and a method of manufacturing the same.

2. Description of the Related Art

The comparative MEMS package structure is formed by Quad Flat No-leads (QFN) technique. For example, a MEMS die is placed on a die paddle of a lead frame and the electrical connection between the MEMS die and the lead frame is attained by wire bonding. However, the use of the wire bond technique may limit miniaturization of the MEMS package structure (e.g. a bottleneck of the dimension of the MEMS package structure is 4.5 millimeters (mm)*4.5 mm*1.2 mm). Moreover, due to the loop height of the bonding wire, the conductive path is relatively long, which causes relatively high resistance (compared with the conductive pillar). The high resistance can adversely affect electrical performance of the MEMS package structure. Further, in the process of packaging the MEMS, the molding compound is selected to have a coefficient of thermal expansion (CTE) close to the CTE of the lead frame; however, such arrangement may inevitably cause a CTE mismatch between the molding compound and the MEMS die, which may hinder performance of the MEMS die or even damage the MEMS die.

SUMMARY

In one aspect according to some embodiments, a micro-electromechanical systems (MEMS) package structure includes: (1) a circuit layer; (2) a MEMS die with an active surface, wherein the active surface faces the circuit layer; (3) a conductive pillar adjacent to the MEMS die; and (4) a package body encapsulating the MEMS die and the conductive pillar, and exposing a top surface of the conductive pillar.

In another aspect according to some embodiments, a MEMS package structure includes: (1) a MEMS die; (2) a conductive pillar adjacent to the MEMS die; (3) a package body encapsulating the MEMS die and the conductive pillar, and exposing a top surface of the conductive pillar; and (4) a binding layer disposed on the package body and on the top surface of the conductive pillar.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
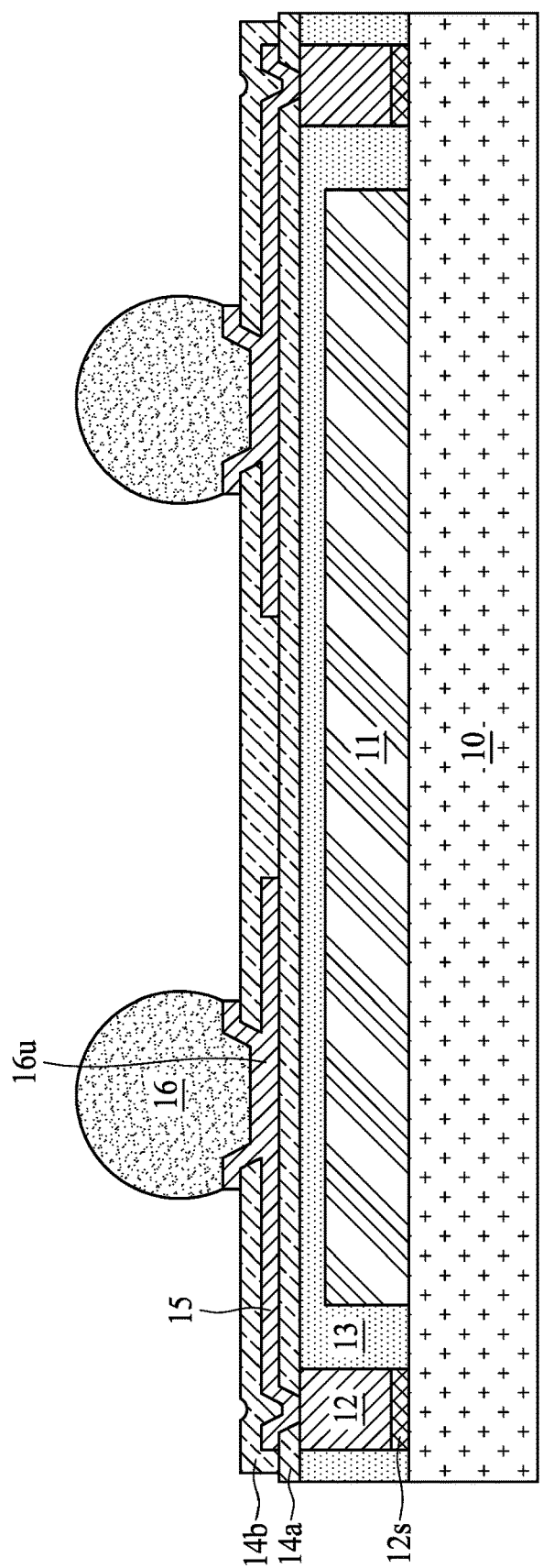
FIG. 1A illustrates a cross-sectional view of a semiconductor package device in accordance with some embodiments of the present disclosure.

FIG. 1A illustrates a cross-sectional view of a semiconductor package device 1A in accordance with some embodiments of the present disclosure. The semiconductor package device 1A includes a circuit layer 10, a MEMS device 11, conductive pillars 12, a package body 13, a binding layer 14a, an insulation layer 14b, a redistribution layer (RDL) 15 and one or more electrical contacts 16.

The circuit layer 10 may include one or more electronic components, such as passive electronic components and/or active electronic components. In some embodiments, the circuit layer 10 may include, e.g., a microprocessor (e.g., a single-core or multi-core microprocessor), a memory device, a chipset, a graphics device, or an application specific integrated circuit (ASIC) according to various embodiments of the present disclosure.

The MEMS device 11 is disposed on the circuit layer 10. In some embodiments, MEMS refers to a class of structures or devices fabricated using semiconductor-like processes and exhibiting mechanical characteristics such as the ability to move or deform. MEMS often, but not always, interact with electrical signals. The MEMS device 11 may be or include, but is not limited to, one or more gyroscopes, accelerometers, pressure sensors, microphones, actuators, mirrors, heaters, printer nozzles magnetometers, or a combination of two or more thereof.

The package body 13 is disposed on the circuit layer 10 to cover or encapsulate at least a portion of the MEMS device 11 or the entire MEMS device 11. In some embodiments, the package body 13 includes, e.g., an epoxy resin including fillers, a molding compound (e.g., an epoxy molding compound or other molding compound), a polyimide, a phenolic compound or material, a material including a silicone dispersed therein, or a combination of two or more thereof. In some embodiments, the composition of the filler in the package body 13 is greater than or equal to, e.g., about 60%, about 70%, about 80%, about 90%, or about 95% by mass. For example, the composition of the filler in the package body 13 may be, e.g., about 87% or about 89%.

In some embodiments, a glass transition temperature (Tg) of the package body 13 is greater than a temperature (Tc) for forming the binding layer 14a or the insulation layer 14b. In some embodiments, the glass transition temperature of the package body 13 is in a range from about 100° C. to about 250° C., from about 125° C. to about 220° C., or from about 150° C. to about 195° C. For example, the glass transition temperature of the package body 13 is in a range from about 155° C. to about 161° C., from about 151° C. to about 160° C. or from about 184° C. to about 195° C. In some embodiments, a coefficient of thermal expansion (CTE) of the package body 13 is in a range from about 4 ppm/° C. to about 12 ppm (parts per million)/° C. For example, the CTE of the package body 13 is in a range from about 7 ppm/° C. to about 9 ppm/° C., from about 10 ppm/° C. to about 12 ppm/° C. or from about 4 ppm/° C. to about 6 ppm/° C.

The conductive pillar 12 penetrates the package body to electrically connect to one or more conductive contacts of the circuit layer 10. A portion of the conductive pillar 12 is encapsulated by the package body 13; and a top surface of the conductive pillar 12 is exposed from the package body 13. In some embodiments, the conductive pillar 12 is disposed adjacent to the MEMS device 11. In some embodiments, a seed layer 12s is disposed between the conductive pillar 12 and the circuit layer 10. In some embodiments, there is no seed layer between the conductive pillar 12 and the package body 13. In other words, lateral surface(s) of the conductive pillar 12 may directly contact the package body 13. In some embodiments, the seed layer 12s comprises, e.g., titanium (Ti), copper (Cu) or a combination thereof.

In some embodiments, the conductive pillar 12 includes a first portion on the circuit layer 10 and a second portion on the first portion. In some embodiments, a thickness of the first portion may be greater than a thickness of the second portion. A time for forming the first portion may be longer than a time for forming the second portion. In some other embodiments, the thickness of the first portion may be less than, or substantially equal to, the thickness of the second portion. In some embodiments, the first portion of the conductive pillar 12 and the second portion of the conductive pillar 12 are made of (or include) the same material. Alternatively, the first portion of the conductive pillar 12 and the second portion of the conductive pillar 12 are made of (or include) different materials. For example, in some embodiments, the first portion of the conductive pillar 12 is made of Cu, while the second portion of the conductive pillar 12 is made of tin (Sn), silver (Ag), nickel (Ni), or a combination of two or more thereof.

The binding layer 14a is disposed on the package body 13 and the top surface of the conductive pillar 12. The binding layer 14a may include at least one recess to expose at least one portion of the top surface of the conductive pillar 12. In some embodiments, the binding layer 14a comprises polyimide (PI), polybenzoxazole (PBO), solder resist, Ajinomoto build-up film (ABF), molding compound, epoxy-based material, or a combination of two or more thereof.

The RDL 15 is disposed on the binding layer 14. The RDL 15 extends into the recess of the binding layer 14a and electrically contacts at least a portion of the top surface of the conductive pillar 12 that is exposed from the package body 13.

The insulation layer 14b is disposed on the binding layer 14a to cover or encapsulate at least a portion of the RDL 15 or the entire RDL 15. The insulation layer 14b may include at least one recess to expose a portion of RDL 15. In some embodiments, the insulation layer 14b comprises PI, PBO, solder resist, ABF, molding compound, epoxy-based material, or a combination of two or more thereof.

A conductive layer 16u (e.g., under bump metallurgy (UBM)) is disposed within the recess of the insulation layer 14b to electrically contact on the exposed portion of the RDL 15. The electrical contact 16 (e.g., C4 pad (controlled collapse chip connection pad)) is disposed on the conductive layer 16u to provide electrical connections between the circuit layer 10 and external device(s). In some embodiments, the semiconductor package device 1A does not include the conductive layer 16u; and the electrical contact 16 is directly disposed within the recess of the insulation layer 14b to electrically contact the exposed portion of the RDL 15.

As mentioned above, the comparative MEMS package structure formed by Quad Flat No-leads (QFN) technique may limit miniaturization of the MEMS package structure (e.g. a bottleneck of the dimension of the MEMS package structure is 4.5 mm*4.5 mm*1.2 mm). In addition, due to the loop height of the bonding wire, the relatively long conductive path may cause high resistance, which would adversely affect electrical performance of the comparative MEMS package structure. In some embodiments shown in FIG. 1A of the present disclosure, by using a conductive pillar 12 to provide an electrical connection, the total size of the semiconductor package device 1A can be reduced (e.g., to about 3.5 mm*2.6 mm*0.5 mm, about 3.0 mm*2.2 mm*0.4 mm, about 2.5 mm*2.0 mm*0.3 mm, or less). In addition, due to the relatively smaller resistance of the conductive pillar 12 (compared to the bonding wire in the comparative MEMS package structure), the semiconductor package device 1 can have a better performance for signal transmission.

Moreover, in the process of packaging the comparative QFN MEMS structure, the molding compound is selected to have a CTE close to the CTE of the lead frame. However, such arrangement may cause a CTE mismatch between the molding compound and the MEMS die. The CTE mismatch may damage the MEMS die or hinder performance of the MEMS die. As shown in the embodiments shown in FIG. 1A of the present disclosure, the semiconductor package device 1A does not include a lead frame structure, and thus the material of the molding compound (e.g., the package body 13) can be selected so that the CTE of the molding compound can match the CTE of the MEMS device 11 to avoid warpage of the semiconductor package device 1A.

Figure 1B:
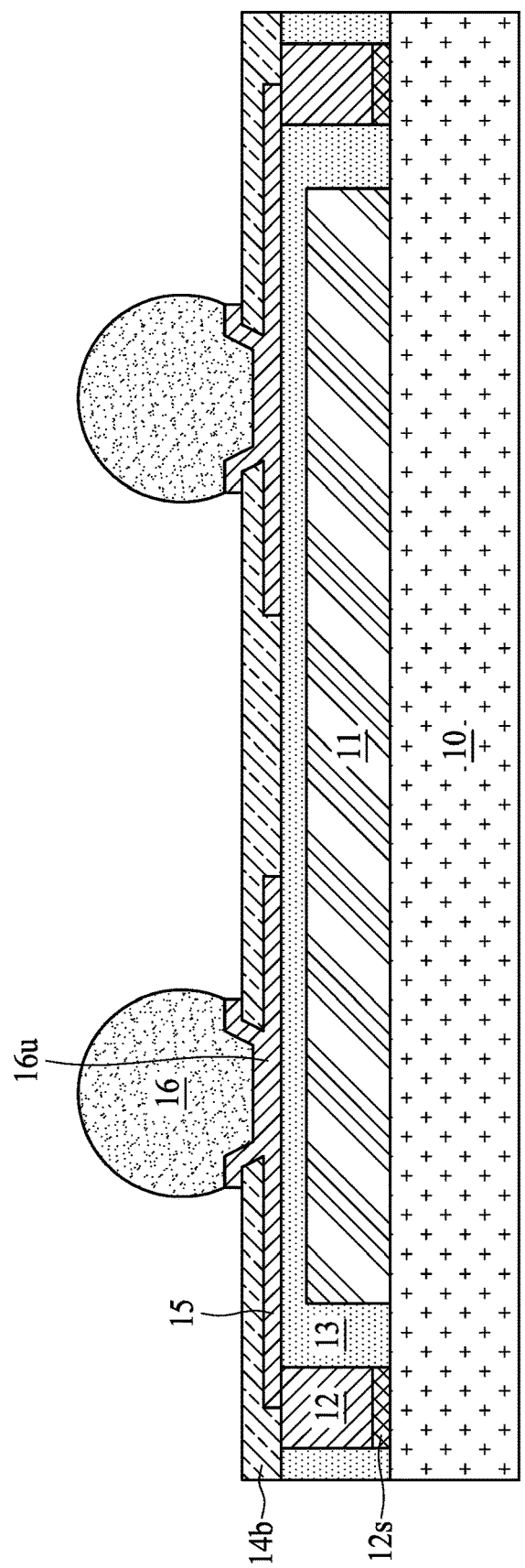
FIG. 1B illustrates a cross-sectional view of a semiconductor package device in accordance with some embodiments of the present disclosure.

In some embodiments, the binding layer 14a may be omitted. FIG. 1B illustrates a cross-sectional view of a semiconductor package device 1B in accordance with some embodiments of the present disclosure. The semiconductor package device 1B is similar to the semiconductor package device 1A shown in FIG. 1A, except that the semiconductor package device 1B includes the insulation layer 14b but does not include a binding layer 14a.

As shown in FIG. 1B, the RDL 15 is disposed on the package body 13 and electrically contacts at least a portion of the top surface of the conductive pillar 12 that is exposed from the package body 13.

The insulation layer 14b is disposed on the package body 13 to cover or encapsulate at least a portion of the RDL 15 or the entire RDL 15. The insulation layer 14b may include at least one recess to expose at least a portion of RDL 15. In some embodiments, the insulation layer 14b comprises PI, PBO, solder resist, ABF, molding compound, epoxy-based material, or a combination of two or more thereof.

The conductive layer 16u (e.g., under bump metallurgy (UBM)) is disposed within the recess of the insulation layer 14b to electrically contact on the exposed portion of the RDL 15. The electrical contact 16 (e.g., C4 pad) is disposed on the conductive layer 16u to provide electrical connections between the circuit layer 10 and external device(s). In some embodiments, the semiconductor package device 1B does not include the conductive layer 16u; and the electrical contact 16 is directly disposed within the recess of the insulation layer 14b to electrically contact on the exposed portion of the RDL 15.

Figure 1C:
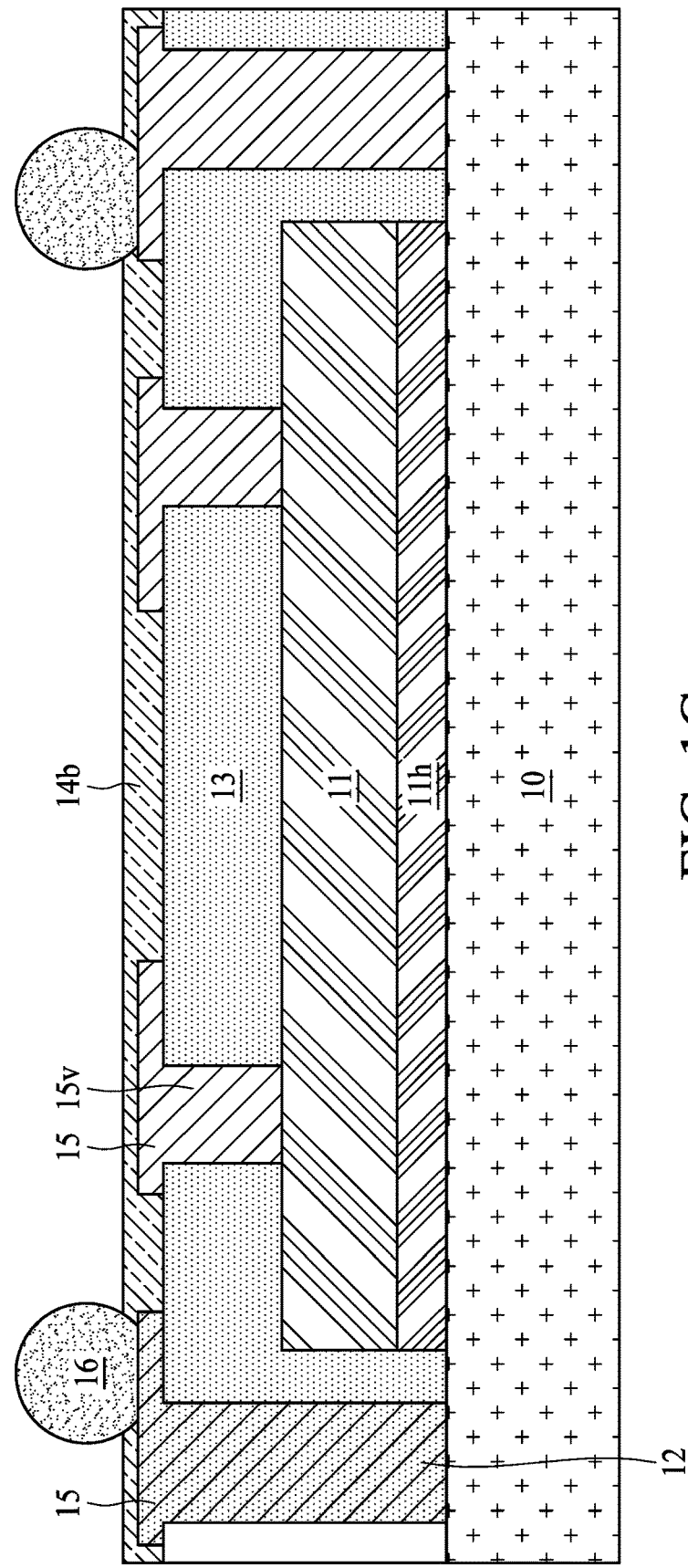
FIG. 1C illustrates a cross-sectional view of a semiconductor package device in accordance with some embodiments of the present disclosure.

FIG. 1C illustrates a cross-sectional view of a semiconductor package device 1C in accordance with some embodiments of the present disclosure. The semiconductor package device 1C is similar to the semiconductor package device 1A shown in FIG. 1A, and at least one difference therebetween is that in the semiconductor package device 1A of FIG. 1A, an active surface of the MEMS device 11 is connected to the circuit layer 10 by, for example, flip-chip technique; while in semiconductor package device 1C of FIG. 1C, a back surface of the MEMS device 11 is connected to the circuit layer 10 through an adhesive layer 11h (e.g., glue). The active surface of the MEMS device is electrically connected to the RDL 15 through electrical connections 15v (e.g., vias) penetrating the package body 13.

Figure 1D:
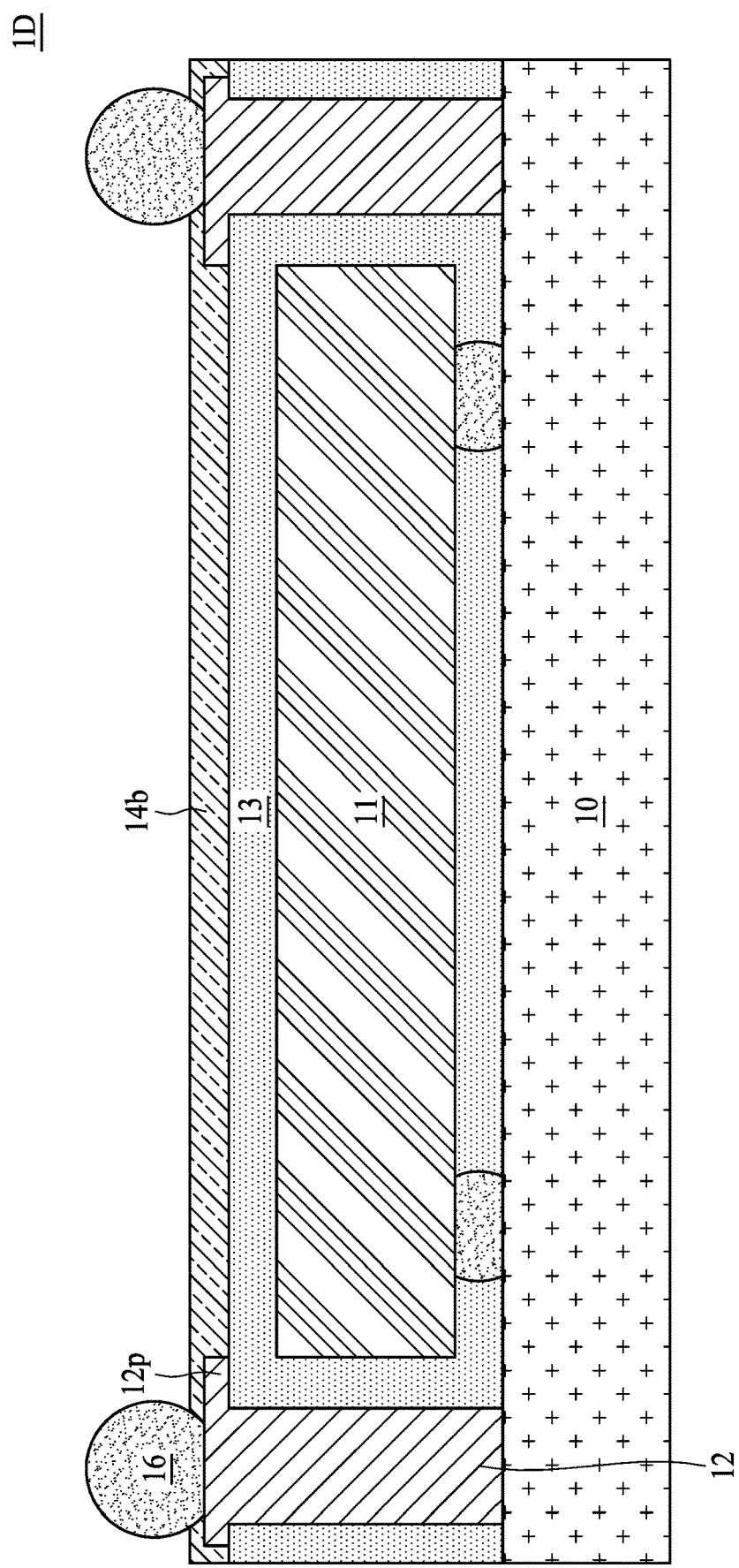
FIG. 1D illustrates a cross-sectional view of a semiconductor package device in accordance with some embodiments of the present disclosure.

FIG. 1D illustrates a cross-sectional view of a semiconductor package device 1D in accordance with some embodiments of the present disclosure. The semiconductor package device 1D is similar to the semiconductor package device 1A shown in FIG. 1A, except that the semiconductor package device 1D does not include the RDL 15 and the binding layer 14a.

As shown in FIG. 1D, a conductive pad 12p is disposed on the package body 13 and electrically contacts at least a portion of the top surface of the conductive pillar 12 that is exposed from the package body 13. The insulation layer 14b is disposed on the package body 13 to cover or encapsulate the conductive pad 12p. The insulation layer 14b includes at least one recess to expose at least one portion of the conductive pad 12p. The electrical contact 16 is disposed on the insulation layer 14b and extends into the recess of the insulation layer 14b to electrically contact the conductive pad 12p.

In accordance with the embodiments shown in FIG. 1D, since the electrical contact 16 is directly disposed on the conductive pad 12p to be electrically connected to the conductive pillar 12, the semiconductor package device 1D does not include additional RDL, reducing the manufacturing cost.

Figure 1E:
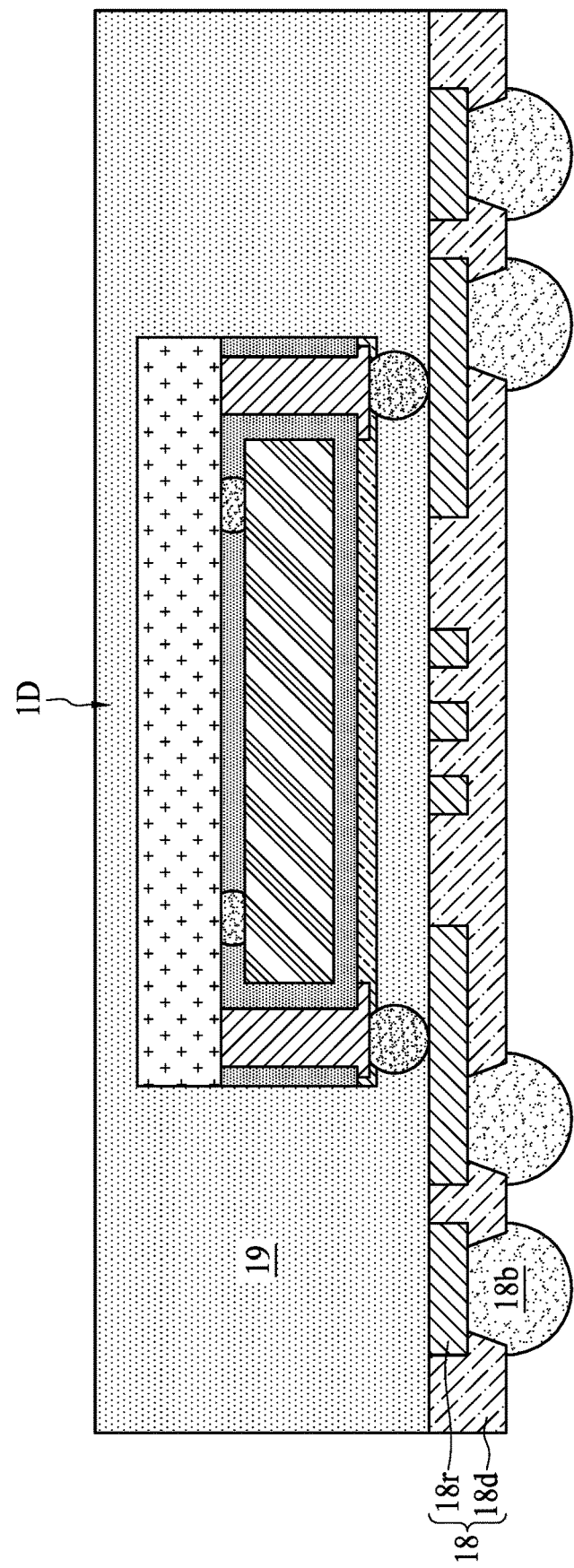
FIG. 1E illustrates a cross-sectional view of a semiconductor package device in accordance with some embodiments of the present disclosure.

FIG. 1E illustrates a cross-sectional view of a semiconductor package device 1E in accordance with some embodiments of the present disclosure. The semiconductor package device 1E includes the semiconductor package device 1D as shown in FIG. 1D, a package body 19 and a substrate 18.

The substrate 18 may be a flexible substrate or a rigid substrate, depending upon the applications according to various embodiments. In some embodiments, the substrate 18 includes a dielectric layer 18d and a conductive patterned layer 18r. At least a portion of a top surface of the conductive patterned layer 18r is exposed from the dielectric layer 18d. The electrical contact of the semiconductor package device 1D is disposed on the exposed portion of the top surface of the conductive patterned layer 18r. In some embodiments, an external contact layer may be also formed or disposed on the substrate 18. In some embodiments, the external contact layer includes a ball grid array (BGA). In other embodiments, the external contact layer includes an array such as, but not limited to, a land grid array (LGA) or a pin grid array (PGA). In some embodiments, the external contact layer includes solder balls 18b, which may include lead or may be leadfree (e.g., including one or more materials such as alloys of gold and tin solder or alloys of silver and tin solder).

The package body 19 is disposed on the substrate 18 to cover or encapsulate the semiconductor package device 1D. In some embodiments, the package body 19 includes an epoxy resin including fillers, a molding compound (e.g., an epoxy molding compound or other molding compound), a polyimide, a phenolic compound or material, a material including a silicone dispersed therein, or a combination of two or more thereof.

Figure 1F:
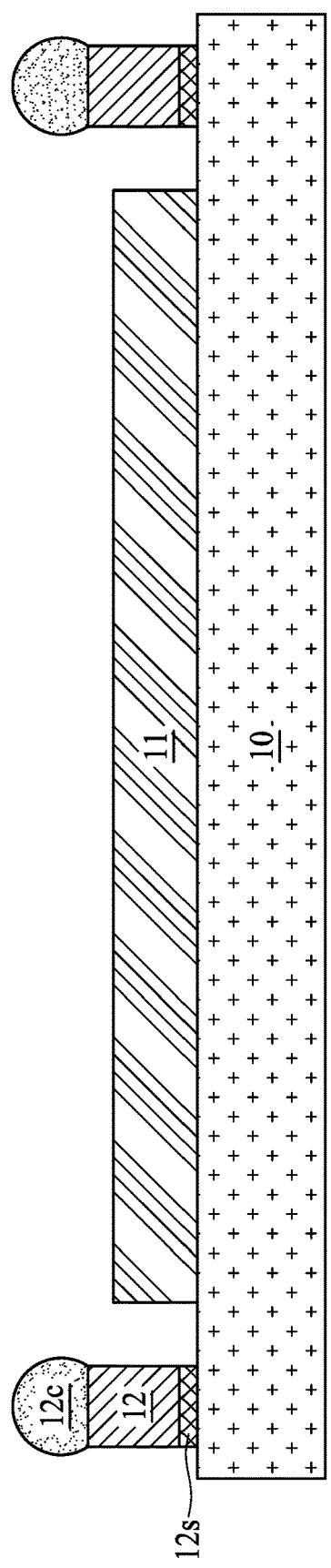
FIG. 1F illustrates a cross-sectional view of a semiconductor package device in accordance with some embodiments of the present disclosure.

FIG. 1F illustrates a cross-sectional view of a semiconductor package device 1F in accordance with some embodiments of the present disclosure. The semiconductor package device 1F is similar to the semiconductor package device 1A shown in FIG. 1A, except that the semiconductor package device 1F does not include the package body 13, the binding layers 14a, the insulation layer 14b or the RDL 15.

As shown in FIG. 1F, the conductive pillar 12 is disposed on the circuit layer 10 and electrically connected to the conductive contacts of the circuit layer 10. The seed layer 12s may be disposed between the conductive pillar 12 and the circuit layer 10. The electrical contact 12c is disposed on the conductive pillar 12. The conductive pillar 12 and the electrical contact 12c provide electrical connections between the circuit layer 10 and external device(s).

Figure 1G:
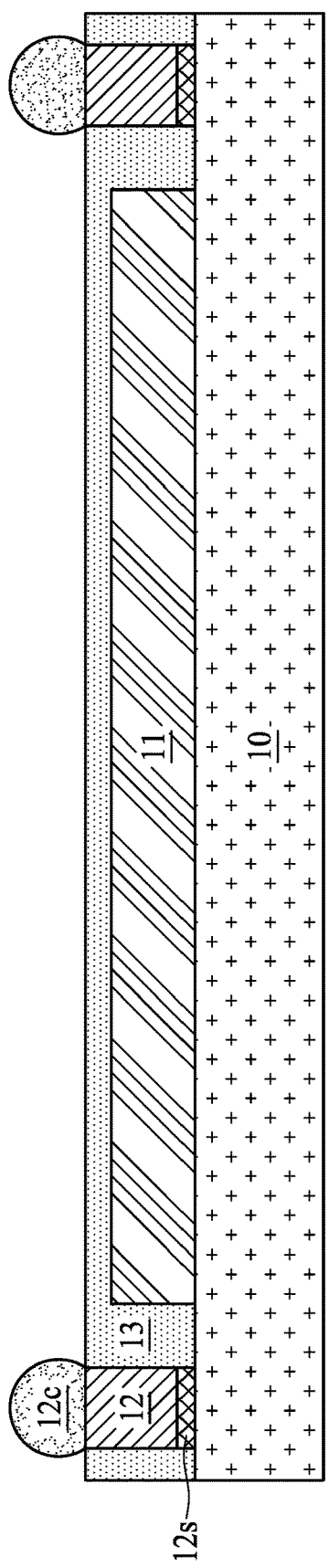
FIG. 1G illustrates a cross-sectional view of a semiconductor package device in accordance with some embodiments of the present disclosure.

FIG. 1G illustrates a cross-sectional view of a semiconductor package device 1G in accordance with some embodiments of the present disclosure. The semiconductor package device 1G is similar to the semiconductor package device 1F shown in FIG. 1F, except that the semiconductor package device 1G further includes a package body 13.

The package body 13 is disposed on the circuit layer 10 to cover or encapsulate the MEMS device 11 and lateral surface(s) of the conductive pillar 12. A top surface of the conductive pillar 12 is exposed from the package body 13. In some embodiments, the package body 13 includes an epoxy resin including fillers, a molding compound (e.g., an epoxy molding compound or other molding compound), a polyimide, a phenolic compound or material, a material including a silicone dispersed therein, or a combination of two or more thereof.

The electrical contact 12c is disposed on the top surface of the conductive pillar 12 that is exposed from the package body 13. The conductive pillar 12 and the electrical contact 12c provide electrical connections between the circuit layer 10 and external device(s).

Figure 1H:
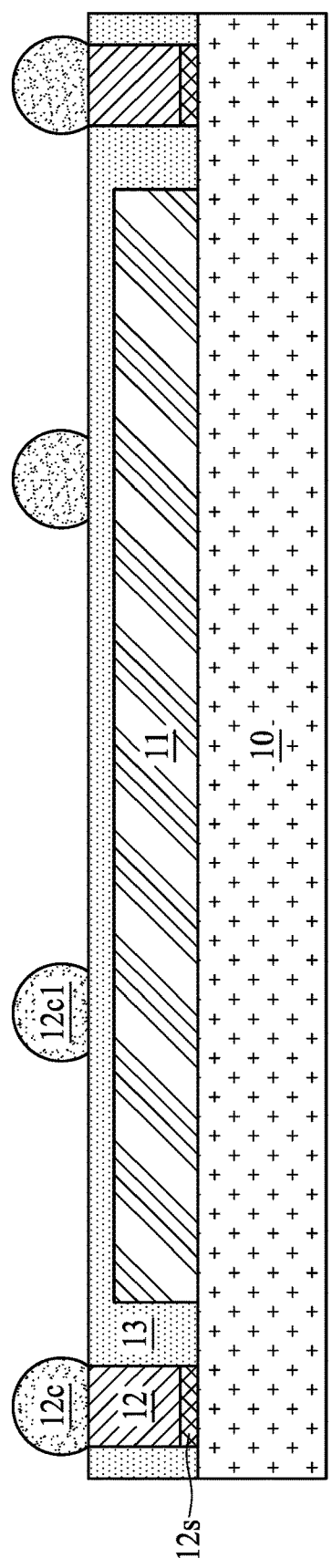
FIG. 1H illustrates a cross-sectional view of a semiconductor package device in accordance with some embodiments of the present disclosure.

FIG. 1H illustrates a cross-sectional view of a semiconductor package device 1H in accordance with some embodiments of the present disclosure. The semiconductor package device 1H is similar to the semiconductor package device 1G shown in FIG. 1G, except that the semiconductor package device 1H further includes one or more support elements 12c1.

The support elements 12c1 are disposed on the package body and electrically isolated from the MEMS device 11 or the circuit layer 10. In some embodiments, the support elements 12c1 may be solder balls or other suitable structures. In some embodiments, the support elements 12c1 may be dummy balls. The dummy balls 12c1 are used to provide an additional support for the semiconductor package device 1H when the semiconductor package device 1H is connected or bonded to other device(s) or circuit board(s).

Figure 1I:
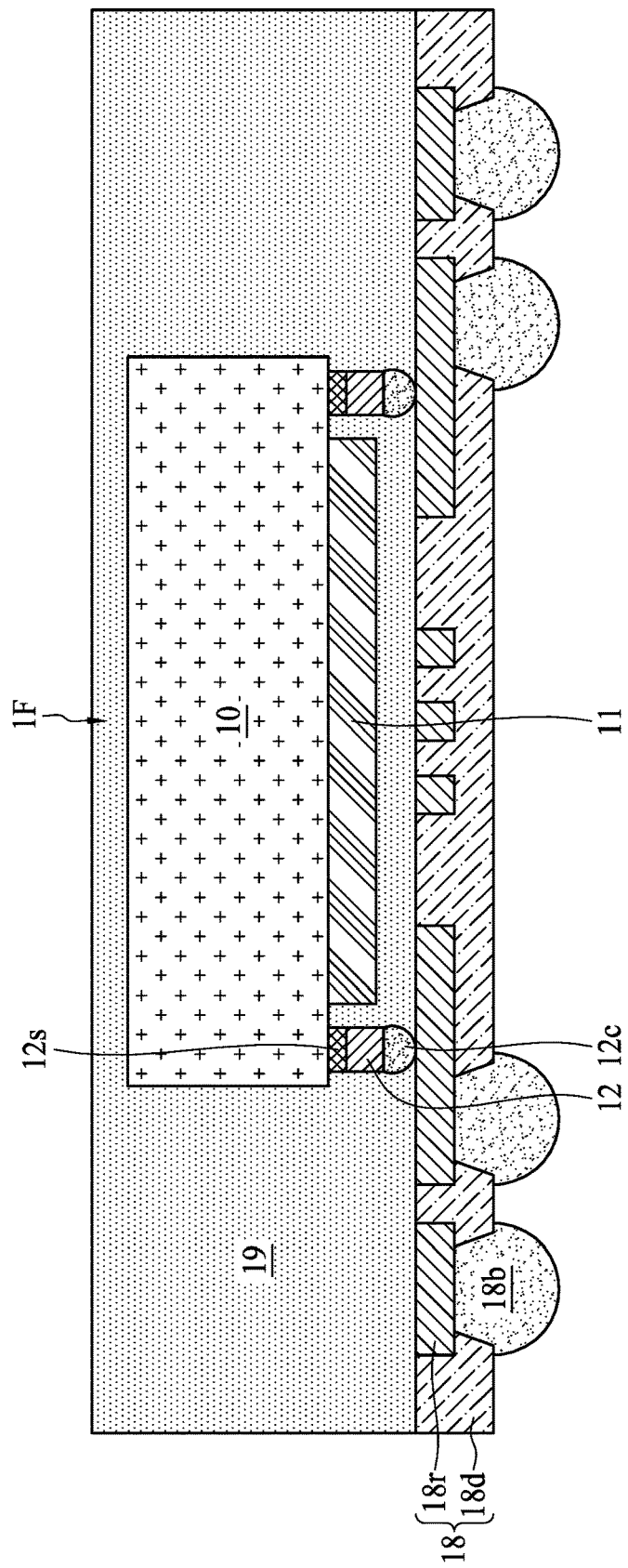
FIG. 1I illustrates a cross-sectional view of a semiconductor package device in accordance with some embodiments of the present disclosure.

FIG. 1I illustrates a cross-sectional view of a semiconductor package device 1I in accordance with some embodiments of the present disclosure. The semiconductor package device 1I includes the semiconductor package device 1F as shown in FIG. 1F, a package body 19 and a substrate 18.

The substrate 18 may be a flexible substrate or a rigid substrate, depending upon the applications according to various embodiments. In some embodiments, the substrate 18 includes a dielectric layer 18d and a conductive patterned layer 18r. At least a portion of a top surface of the conductive patterned layer 18r is exposed from the dielectric layer 18d. The electrical contact 12c of the semiconductor package device 1F is disposed on the exposed portion of the top surface of the conductive patterned layer 18r. In some embodiments, an external contact layer may be also formed or disposed on the substrate 18. In some embodiments, the external contact layer includes a BGA. In other embodiments, the external contact layer includes an array such as, but not limited to, an LGA or a PGA. In some embodiments, the external contact layer includes solder balls 18b, which may include lead or may be lead-free (e.g., including one or more materials such as alloys of gold and tin solder or alloys of silver and tin solder).

The package body 19 is disposed on the substrate 18 to cover or encapsulate the semiconductor package device 1F. In some embodiments, the package body 18 includes an epoxy resin including fillers, a molding compound (e.g., an epoxy molding compound or other molding compound), a polyimide, a phenolic compound or material, a material including a silicone dispersed therein, or a combination of two or more thereof.

FIGS. 2A, 2B, 2C, 2D, 2D', 2E, 2F, 2G and 2H are cross-sectional views of a semiconductor structure fabricated at various stages, in accordance with some embodiments of the present disclosure. Various figures may be simplified for a better understanding of the aspects of the present disclosure.

Figure 2A:
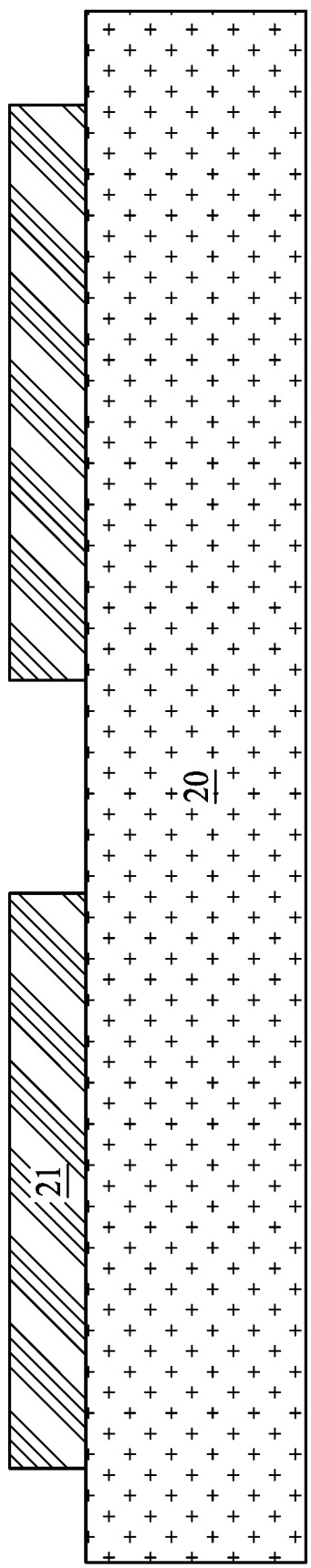
FIG. 2A illustrates various stage(s) of a method of manufacturing a semiconductor package in accordance with some embodiments of the present disclosure.

Referring to FIG. 2A, a circuit layer 20 is provided. The circuit layer 20 may include one or more electronic components, such as passive electronic components and/or active electronic components. In some embodiments, the circuit layer 20 may include, a microprocessor (e.g., a single-core or multi-core microprocessor), a memory device, a chipset, a graphics device, or an ASIC according to various embodiments of the present disclosure.

The MEMS device 21 is disposed on the circuit layer 20. The MEMS device 21 may be or include, but is not limited to, one or more gyroscopes, accelerometers, pressure sensors, microphones, actuators, mirrors, heaters, printer nozzles magnetometers, or a combination of two or more thereof. In some embodiments, the MEMS device 21 can be connected to the circuit layer 20 by, for example, flip-chip technique.

Figure 2B:
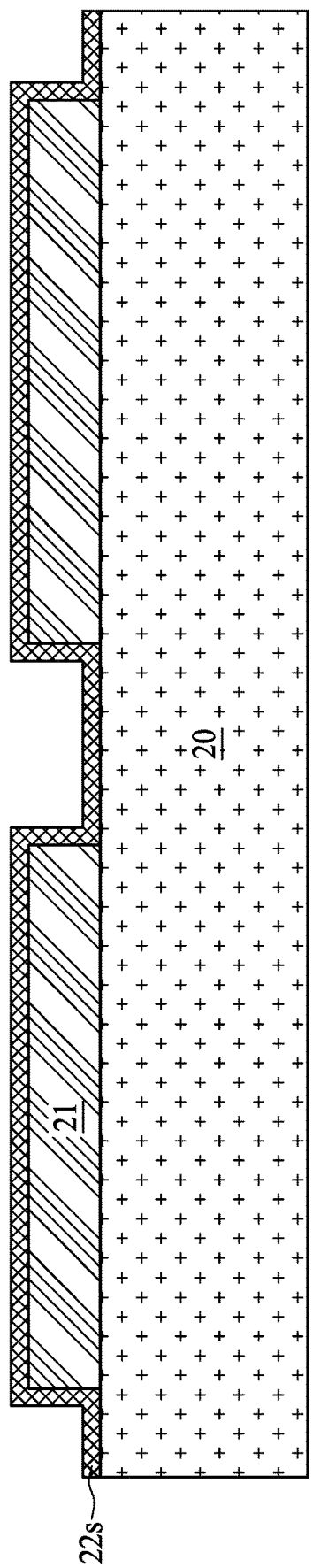
FIG. 2B illustrates various stage(s) of a method of manufacturing a semiconductor package in accordance with some embodiments of the present disclosure.

Referring to FIG. 2B, a seed layer 22s is formed on a top surface of the circuit layer 20 and a top surface and lateral surface(s) of the MEMS device 21. In some embodiments, the seed layer 22s comprises Ti, Cu or a combination thereof. In some embodiments, the seed layer 22s can be formed by, e.g., sputtering or other suitable techniques.

Figure 2C:
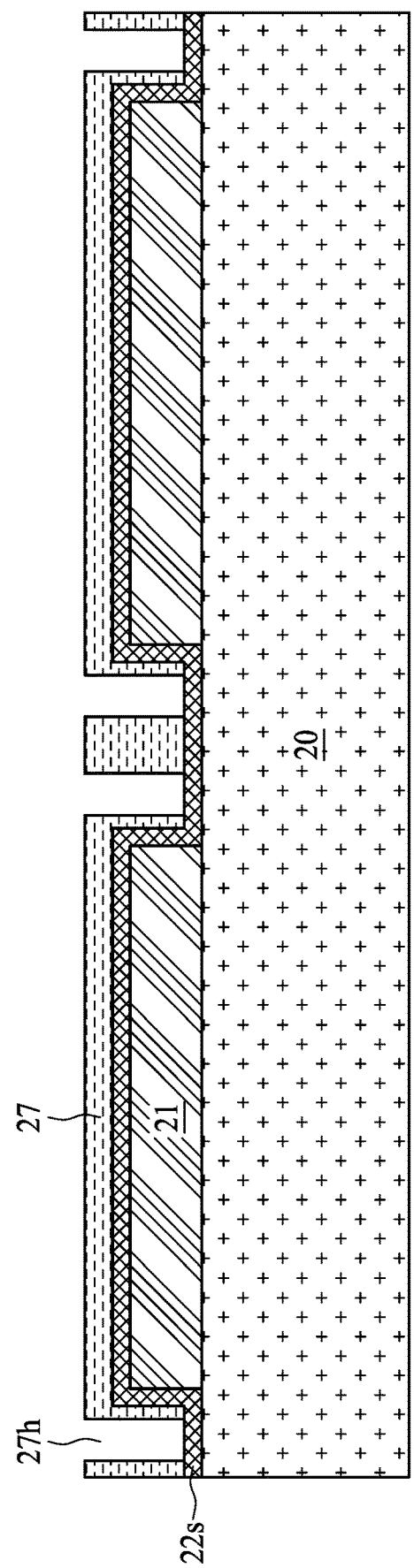
FIG. 2C illustrates various stage(s) of a method of manufacturing a semiconductor package in accordance with some embodiments of the present disclosure.

Referring to FIG. 2C, a photoresist layer 27 is formed on the seed layer 22s; and one or more openings 27h are formed at predetermined location(s) to penetrate the photoresist layer 27 and to expose the seed layer 22s. In some embodiments, the photoresist layer 27 is a dry film photoresist or other suitable photoresist. In some embodiments, the openings 27h can be formed by, e.g., etching, laser drilling or other suitable processes.

Figure 2D:
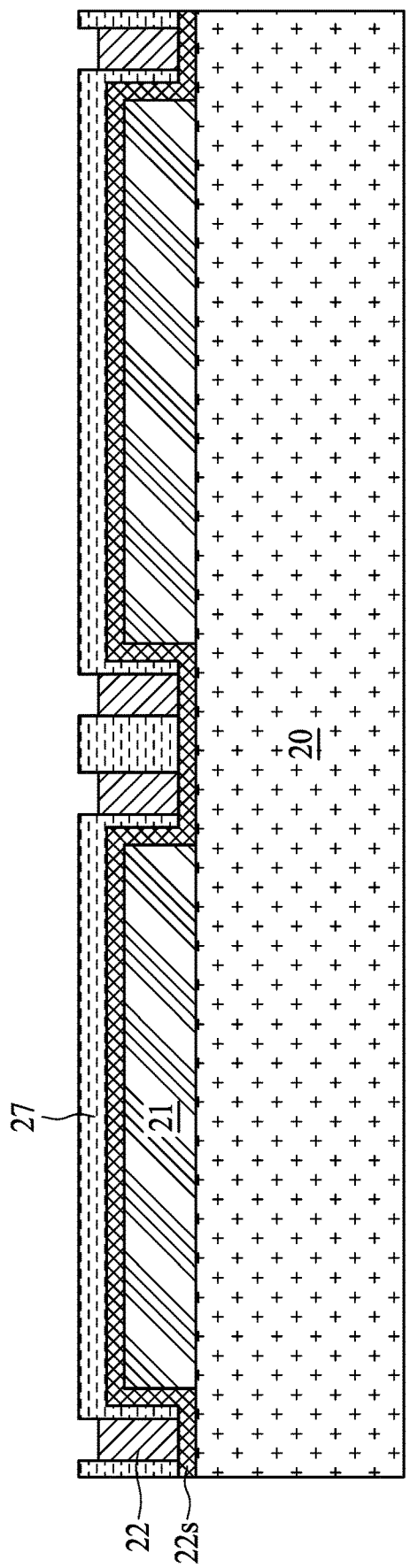
FIG. 2D illustrates various stage(s) of a method of manufacturing a semiconductor package in accordance with some embodiments of the present disclosure.
Figure 2D:
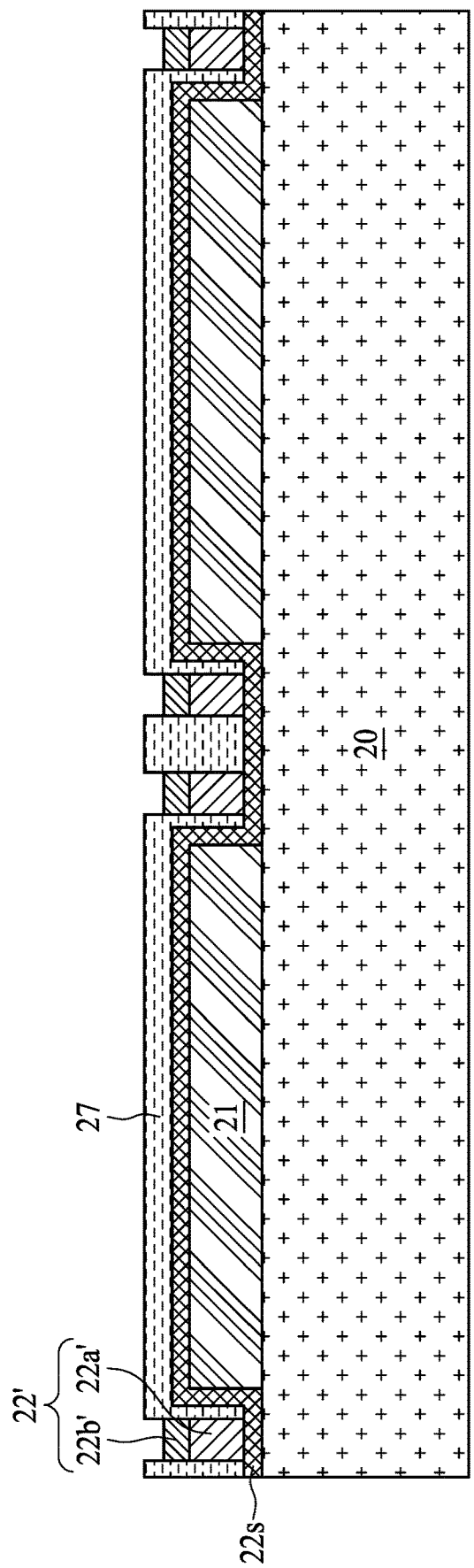

Referring to FIG. 2D, a conductive pillar 22 is formed within the openings 27h and on at least a portion of the seed layer 22s that is exposed from the photoresist layer 27. In some embodiments, the conductive pillar 22 is formed by, e.g., electroplating or other suitable processes. In some embodiments, the conductive pillar 22 may be formed by a single electroplating process. In some other embodiments, referring to FIG. 2D', the conductive pillar 22' may include two (or more) portions (e.g., a first portion 22a' on the seed layer 22s and a second portion 22b' on the first portion 22a') formed by two (or more) electroplating processes. A thickness of the first portion 22a' is greater than a thickness of the second portion 22b'. In some other embodiments, the thickness of the first portion 22a' may be less than, or substantially equal to, the thickness of the second portion 22b'. In some embodiments, the first portion 22a' of the conductive pillar 22' and the second portion 22b' of the conductive pillar 22' are made of (or include) the same material. Alternatively, the first portion 22a' of the conductive pillar 22' and the second portion 22b' of the conductive pillar 22' are made of (or include) different materials. For example, in some embodiments, the first portion 22a' of the conductive pillar 22' is made of Cu, while the second portion 22b' of the conductive pillar 22' is made of Sn, Ag, Ni, or a combination of two or more thereof.

Figure 2E:
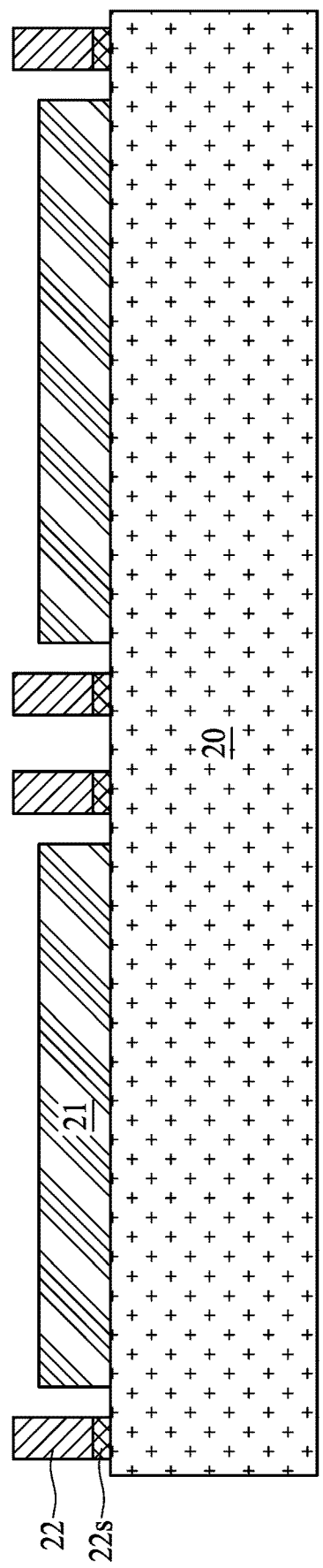
FIG. 2E illustrates various stage(s) of a method of manufacturing a semiconductor package in accordance with some embodiments of the present disclosure.

Referring to FIG. 2E, the photoresist layer 27 and at least a portion of the seed layer 22s are removed. In some embodiments, the photoresist layer 27 and the portion of the seed layer 22s can be removed by, e.g., etching or other suitable processes. After the operation shown in FIG. 2E, there may be seed layer 22s that exists between the conductive pillar 22 and the circuit layer 20.

Figure 2F:
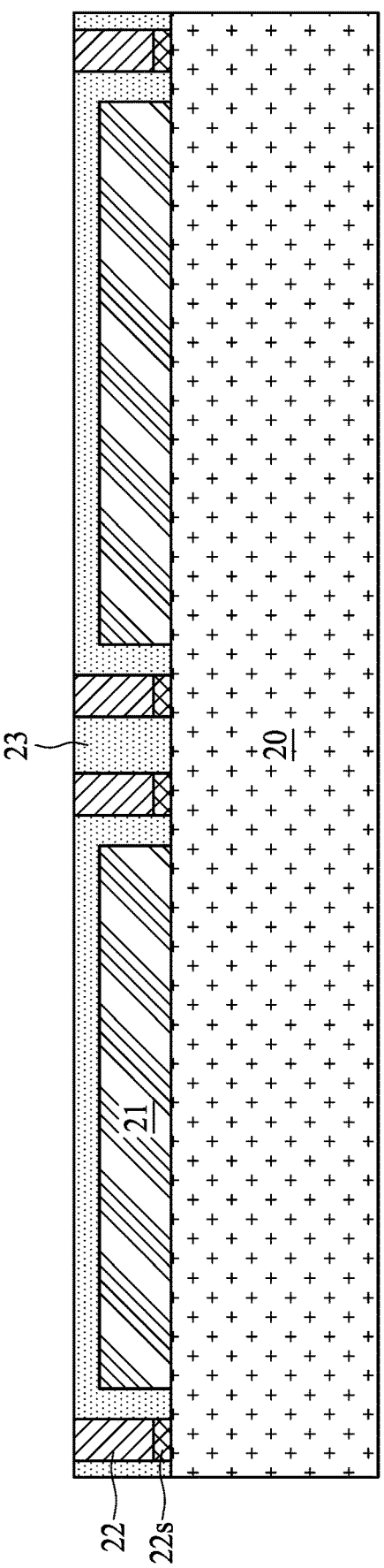
FIG. 2F illustrates various stage(s) of a method of manufacturing a semiconductor package in accordance with some embodiments of the present disclosure.

Referring to FIG. 2F, a package body 23 is formed or disposed to cover or encapsulate a top surface of the circuit layer 20, the MEM device 21 and the conductive pillar 22. In some embodiments, the package body 23 includes an epoxy resin including fillers (e.g., $SiO_2$), a molding compound (e.g., an epoxy molding compound or other molding compound), a polyimide, a phenolic compound or material, a material including a silicone dispersed therein, or a combination of two or more thereof. In some embodiments, the composition of the filler in the package body 23 is greater than or equal to, e.g., about 60%, about 70%, about 80%, about 90%, or about 95% by mass. For example, the composition of the filler in the package body 23 may be, e.g., about 87% or about 89%. In some embodiments, the glass transition temperature of the package body 23 is in a range from about 100° C. to about 250° C., from about 125° C. to about 220° C., or from about 150° C. to about 195° C. For example, the glass transition temperature of the package body 23 is in a range from about 155° C. to about 161° C., from about 151° C. to about 160° C. or from about 184° C. to about 195° C. In some embodiments, a CTE of the package body 23 is in a range from about 4 ppm/° C. to about 12 ppm/° C. For example, the CTE of the package body 23 is in a range from about 7 ppm/° C. to about 9 ppm/° C., from about 10 ppm/° C. to about 12 ppm/° C. or from about 4 ppm/° C. to about 6 ppm/° C.

In some embodiments, a portion of the package body 23 is then removed to expose a top surface of the conductive pillar 22. In some embodiments, the removing operation is carried out by, e.g., grinding or other suitable processes.

Figure 2G:
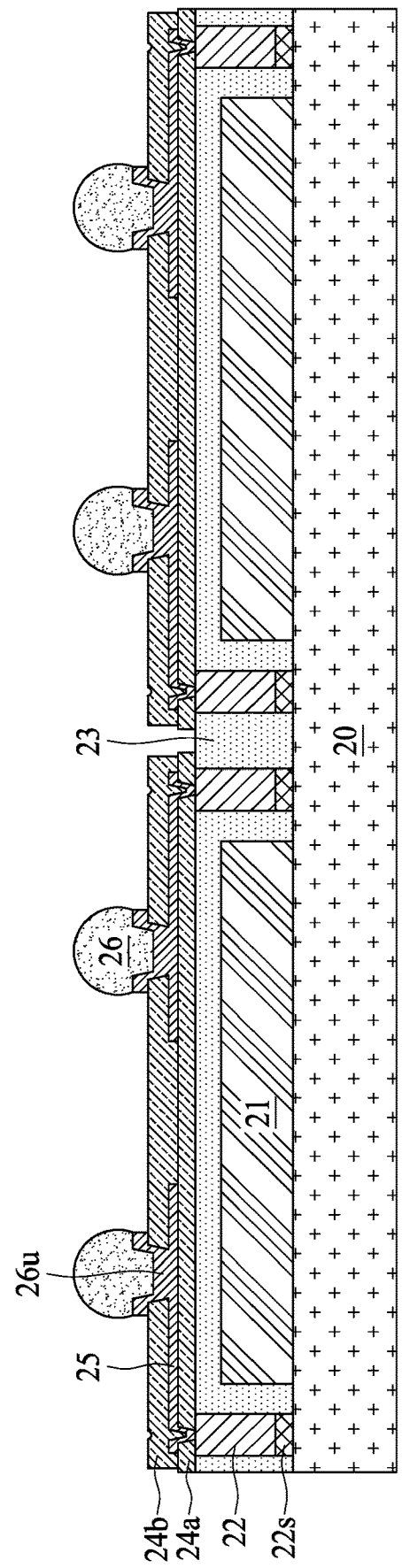
FIG. 2G illustrates various stage(s) of a method of manufacturing a semiconductor package in accordance with some embodiments of the present disclosure.

Referring to FIG. 2G, a binding layer 24a is formed on the package body 23. The binding layer 24a may include at least one recess to expose at least a portion of the top surface of the conductive pillar 22. In some embodiments, the binding layer 24a comprises PI, PBO, solder resist, ABF, molding compound, epoxy-based material, or a combination of two or more thereof. In some embodiments, a temperature for forming the binding layer 24a is less than the glass transition temperature of the package body 23. In some embodiments, the temperature for forming the binding layer 24a is a curing temperature of a material of the binding layer 24a. In some embodiments, if the temperature for forming the binding layer 24a is greater than, or substantially equal to, the glass transition temperature of the package body 23 and the time for forming the binding layers 24 is long (e.g., 2 hours), the CTE of the package body 23 may increase (e.g., as a result of undergoing a conversion at or above the glass transition temperature). In this case, the difference between the CTE of the package body 23 and the CTE of the MEMS device 21 or the CTE of the circuit layer 20 may increase as well, which may lead to warpage of the semiconductor package device.

A RDL 25 is formed on the binding layer 24a and extends into the recess of the binding layer 24 to electrically contact the exposed portion of the top surface of the conductive pillar 22.

An insulation layer 24b is formed on the RDL 25. The insulation layer 24b may include a recess to expose a portion of the RDL 25. In some embodiments, the insulation layer 24b comprises PI, PBO, solder resist, ABF, molding compound, epoxy-based material, or a combination of two or more thereof. In some embodiments, a temperature for forming the insulation layer 24b is less than the glass transition temperature of the package body 23. In some embodiments, the temperature for forming the insulation layer 24b is a curing temperature of a material of the insulation layer 24b.

A conductive layer 26u (e.g., UBM) is formed or disposed in the recess of the insulation layer 24b to contact the exposed portion of the RDL 25, and then an electrical contact 26 (e.g., a C4 pad) is formed or disposed on the conductive layer 26u. In some embodiments, at least a portion of a back side of the circuit layer 20 may be removed by, e.g., grinding process.

Figure 2H:
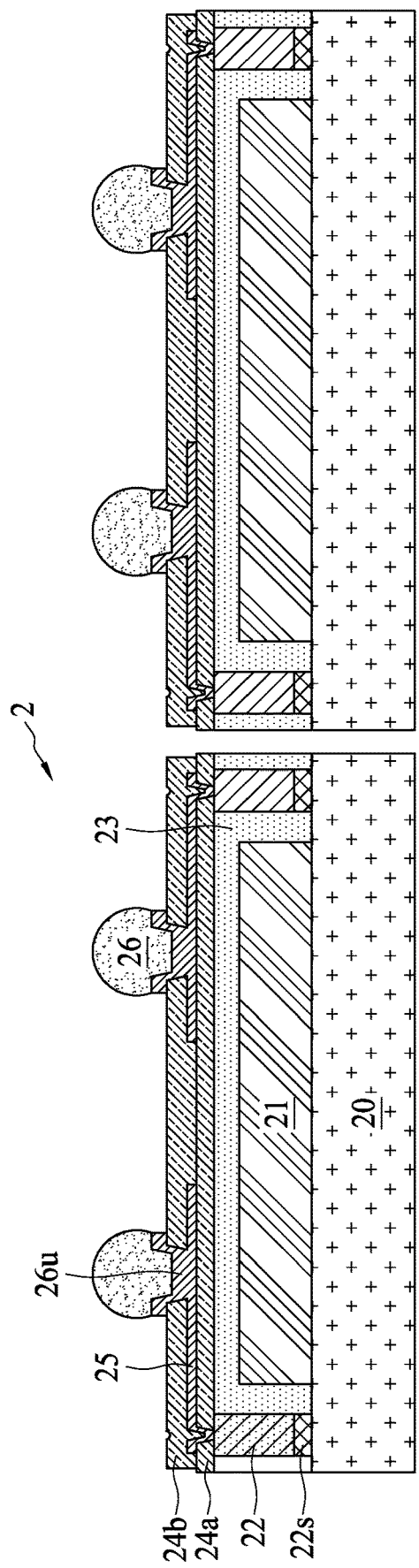
FIG. 2H illustrates various stage(s) of a method of manufacturing a semiconductor package in accordance with some embodiments of the present disclosure.

Referring to FIG. 2H, a singulation is performed to form the semiconductor package device 2. For example, the singulation may be performed through the binding layer 24a, the insulation layer 24b, the RDL 25, the package body 23 and the circuit layer 20. The singulation may be performed, for example, by using a dicing saw, laser or other appropriate cutting technique. In some embodiments, the semiconductor package device 2 is similar to the semiconductor package device 1A shown in FIG. 1A.

Figure 3A:
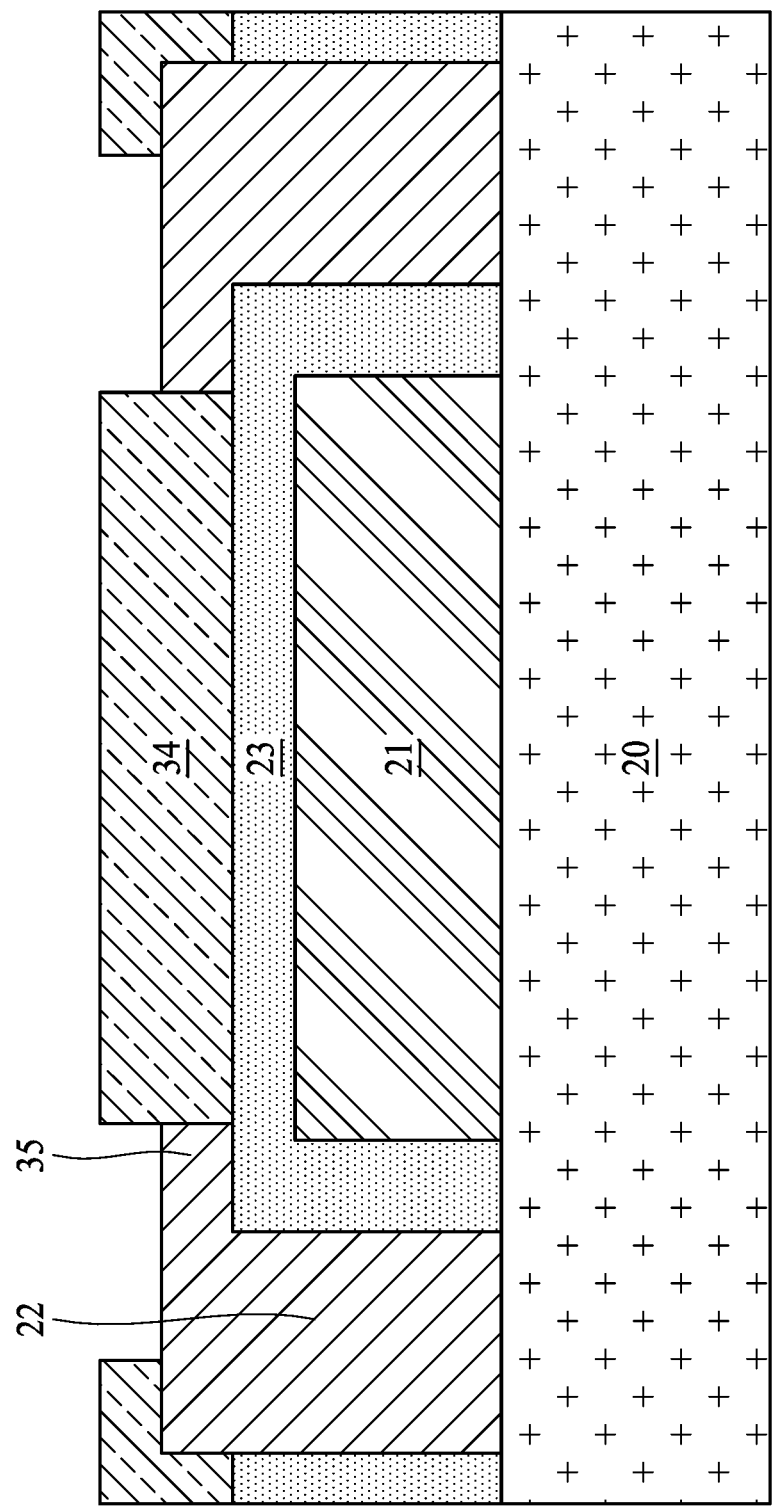
FIG. 3A illustrates various stage(s) of a method of manufacturing a semiconductor package in accordance with some embodiments of the present disclosure.
Figure 3B:
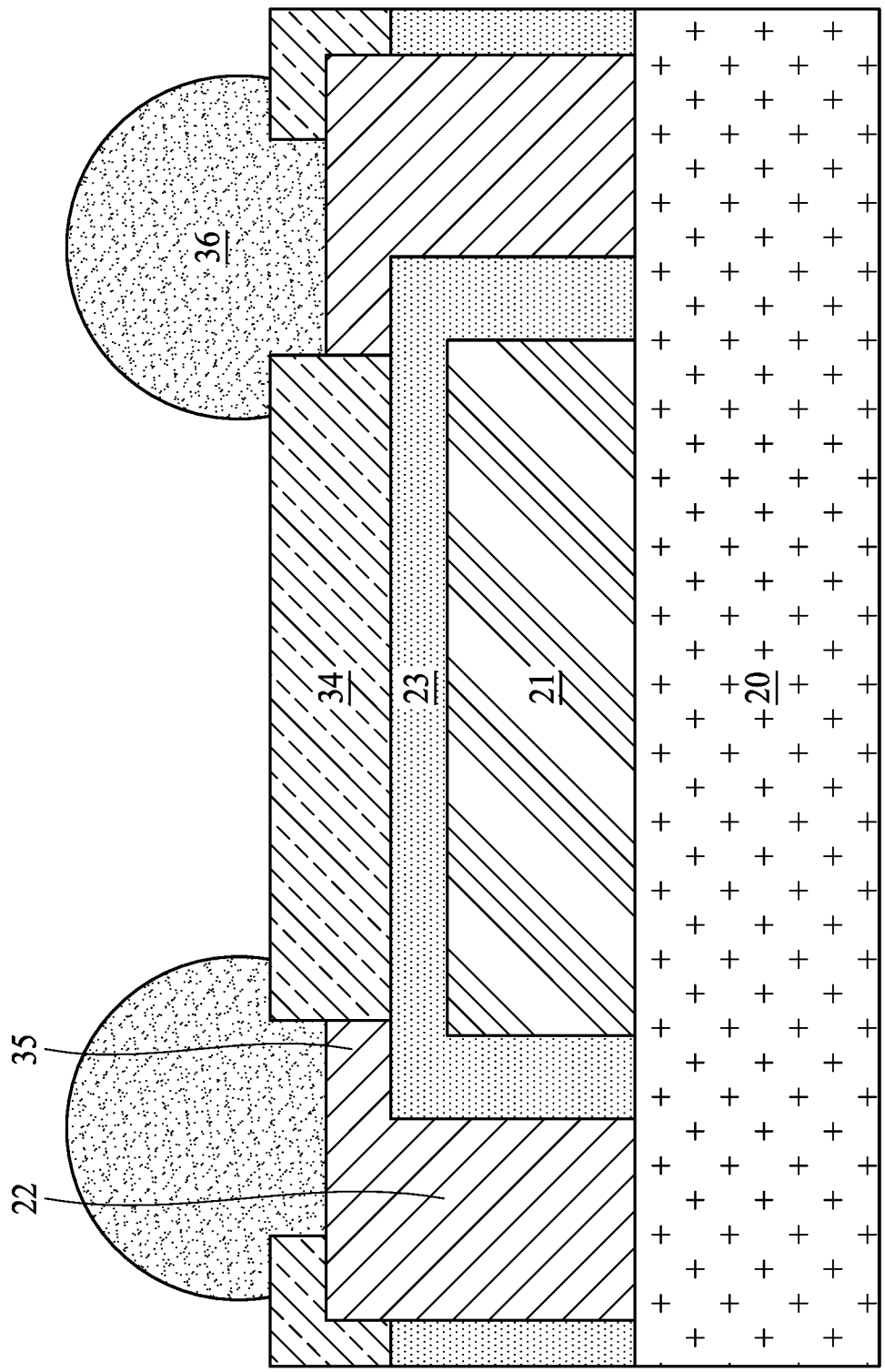
FIG. 3B illustrates various stage(s) of a method of manufacturing a semiconductor package in accordance with some embodiments of the present disclosure.

FIGS. 3A and 3B are cross-sectional views of a semiconductor structure fabricated at various stages, in accordance with some embodiments of the present disclosure. Various figures may have been simplified for a better understanding of the aspects of the present disclosure. In some embodiments, the operations shown in FIG. 3A may be carried out after the operations shown in FIG. 2F.

Referring to FIG. 3A, a conductive layer 35 is formed on at least a portion of the top surface of the conductive pillar 22 that is exposed from the package body 23. In some embodiments, the conductive layer 35 may be formed by the following operations: (i) defining regions for the following physical vapor deposition (PVD) process by using a shadow mask; and (ii) depositing conductive material (e.g., Cu) to form the conductive layer 35. Alternatively, the conductive layer 35 may be formed by the following operations: (i)

defining regions of the conductive layer 35 by using laser drilling to remove a portion of the package body 23; and (ii) forming the conductive layer 35 by printing.

After the conductive layer 35 is deposited, an oxide layer 34 is formed on the package body 23. At least a portion of the conductive layer 35 is exposed from the oxide layer 34. In some embodiments, the oxide layer 35 is formed by using, e.g., a PVD process.

Referring to FIG. 3B, an electrical contact 36 (e.g., a C4 pad) is formed or disposed on the exposed portion of the conductive layer 35. In some embodiments, the electrical contact 36 is a solder ball (e.g., Sn ball). In some embodiments, a Ni layer may be deposited on the conductive layer 35 before the formation of the oxide layer 35 to improve the adhesion between the conductive layer 35 and the electrical contact 36.

In some embodiments as shown in FIG. 2G, the binding layer 24a and the insulation layer 24b may be selected from, e.g., PI or PBO or a combination thereof. However, the temperature (e.g., about 200° C. to about 450° C., about 200° C. to about 400° C., or about 200° C. to about 350° C.) for curing the PI or PBO is higher than the glass transition temperature (e.g., about 150° C. to about 195° C.) of the package body 23. Therefore, after the PI or PBO binding layer is formed, the wafer may be bent (e.g., wafer warpage), which may lead to robot handling issue, wafer crack or increased stress of the die. As shown in the operations shown in FIGS. 3A and 3B, since the conductive layer 35 and the oxide layer 34 are formed by PVD process, the manufacturing process does not involve a process with a temperature higher than the glass transition temperature of the package body 23 (e.g., photolithography, electroplating, PI or PBO curing), and therefore avoids reliability issues as mentioned above.

Figure 4A:
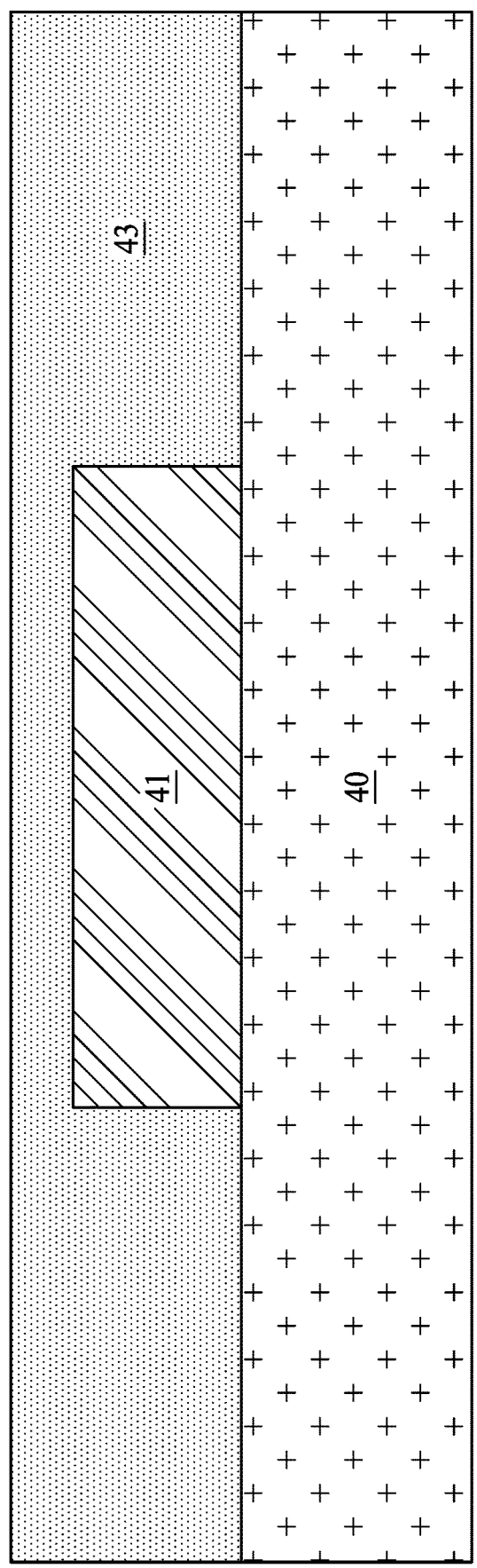
FIG. 4A illustrates various stage(s) of a method of manufacturing a semiconductor package in accordance with some embodiments of the present disclosure.
Figure 4B:
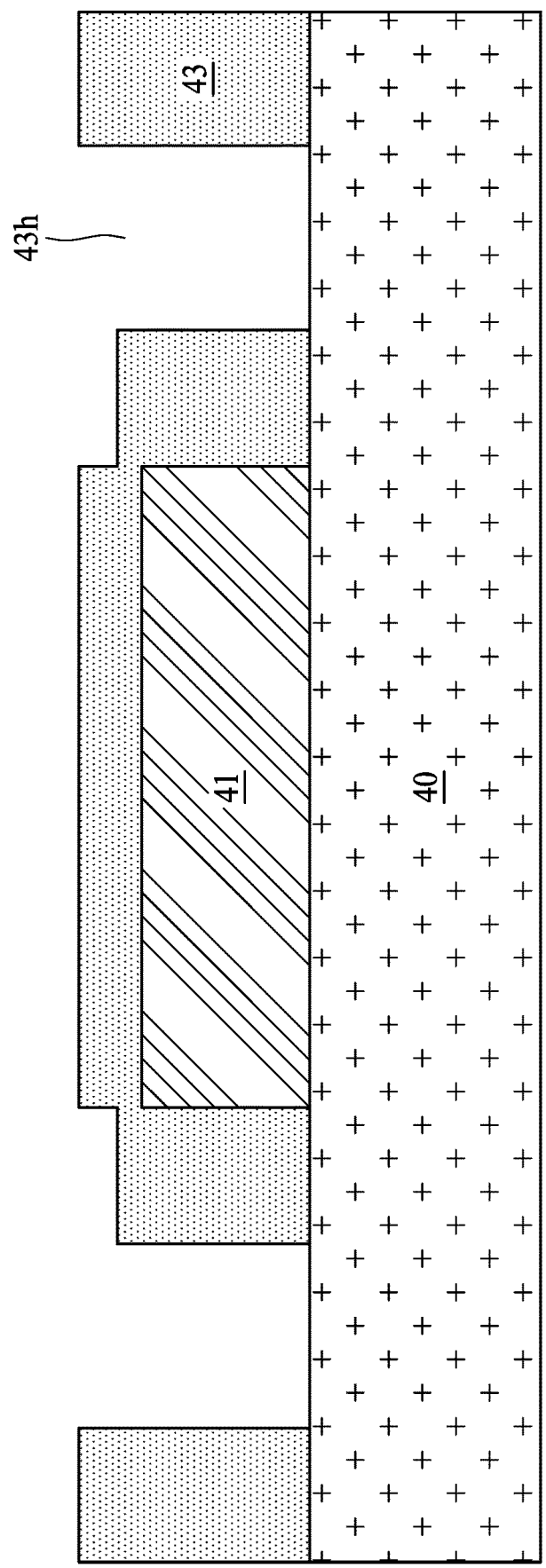
FIG. 4B illustrates various stage(s) of a method of manufacturing a semiconductor package in accordance with some embodiments of the present disclosure.
Figure 4C:
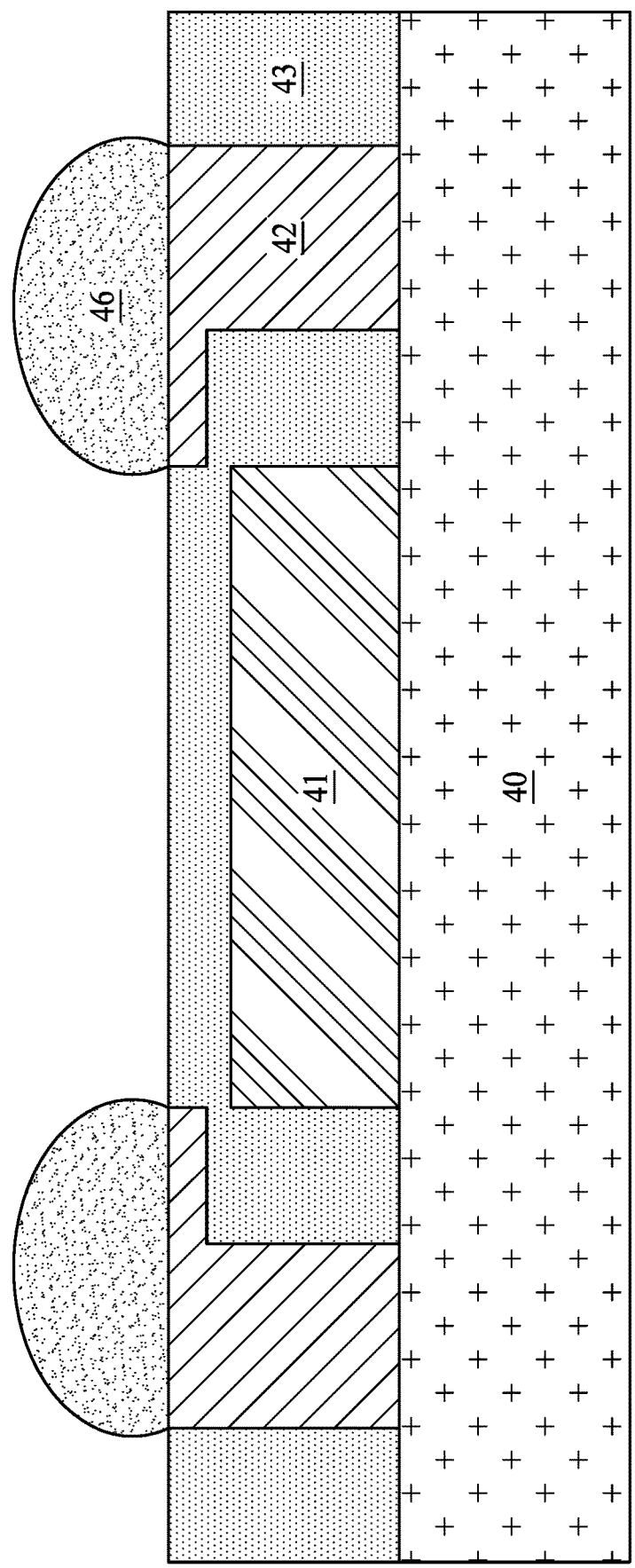
FIG. 4C illustrates various stage(s) of a method of manufacturing a semiconductor package in accordance with some embodiments of the present disclosure.

FIGS. 4A, 4B and 4C are cross-sectional views of a semiconductor structure fabricated at various stages, in accordance with some embodiments of the present disclosure. Various figures may have been simplified for a better understanding of the aspects of the present disclosure.

Referring to FIG. 4A, a circuit layer 40 is provided. The circuit layer 40 may include one or more electronic components, such as passive electronic components and/or active electronic components. In some embodiments, the circuit layer 40 may include, a microprocessor (e.g., a single-core or multi-core microprocessor), a memory device, a chipset, a graphics device, or an ASIC according to various embodiments of the present disclosure.

The MEMS device 41 is disposed on the circuit layer 40. The MEMS device 41 may be or include, but is not limited to, one or more gyroscopes, accelerometers, pressure sensors, microphones, actuators, mirrors, heaters, printer nozzles magnetometers or a combination of two or more thereof. In some embodiments, the MEMS device 41 can be connected to the circuit layer 40 by, for example, flip-chip technique.

A package body 43 is formed or disposed to cover or encapsulate a top surface of the circuit layer 40 and the MEM device 41. In some embodiments, the package body 43 includes an epoxy resin including fillers, a molding compound (e.g., an epoxy molding compound or other molding compound), a polyimide, a phenolic compound or material, a material including a silicone dispersed therein, or a combination of two or more thereof.

Referring to FIG. 4B, a portion of the package body 43 is removed to form openings 43h to expose the circuit layer 40. In some embodiments, the package body 43 can be removed by using, e.g., laser drilling or other suitable processes.

Referring to FIG. 4C, a conductive material (e.g., Cu, Ni or a combination thereof) is filled within the one or more openings 43h to form the conductive pillar 42 by, e.g., screen printing process. An electrical contact 46 (e.g., a C4 pad) is then formed or disposed on the conductive pillar 42. In some embodiments, the electrical contact 46 is a solder ball (e.g., Sn ball).

As shown in the operations shown in FIGS. 4A-4C, since the conductive pillar 42 is formed by screen printing process, the manufacturing process does not involve a process with a temperature higher than the glass transition temperature of the package body 43 (e.g., photolithography, electroplating, PI or PBO curing), and therefore avoids reliability issues as mentioned above.

FIGS. 5A, 5B, 5C and 5D are cross-sectional views of a semiconductor structure fabricated at various stages, in accordance with some embodiments of the present disclosure. Various figures may have been simplified for a better understanding of the aspects of the present disclosure.

Figure 5A:
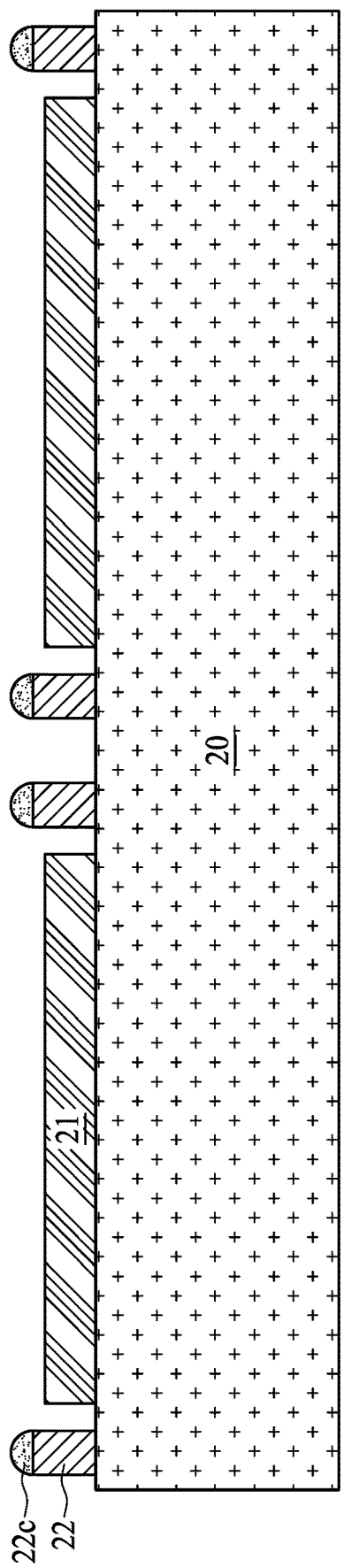
FIG. 5A illustrates various stage(s) of a method of manufacturing a semiconductor package in accordance with some embodiments of the present disclosure.

Referring to FIG. 5A, the conductive pillar 22 is formed on the circuit layer 20 and electrically connected to the conductive contacts of the circuit layer 20. In some embodiments, an electrical contact 22c may be formed on the conductive pillar 22.

Figure 5B:
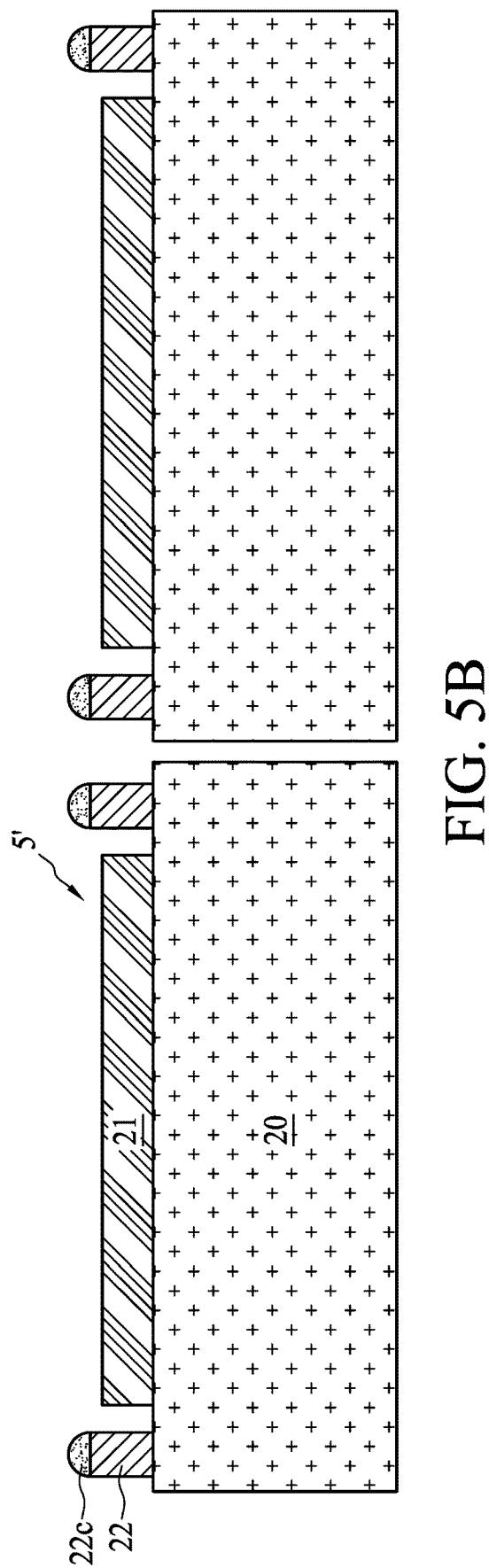
FIG. 5B illustrates various stage(s) of a method of manufacturing a semiconductor package in accordance with some embodiments of the present disclosure.

Referring to FIG. 5B, a singulation is performed to form the semiconductor package device 5'. For example, the singulation may be performed through the circuit layer 20. The singulation may be performed, for example, by using a dicing saw, laser or other appropriate cutting technique. In some embodiments, the semiconductor package device 5' is similar to the semiconductor package device 1B shown in FIG. 1B.

Figure 5C:
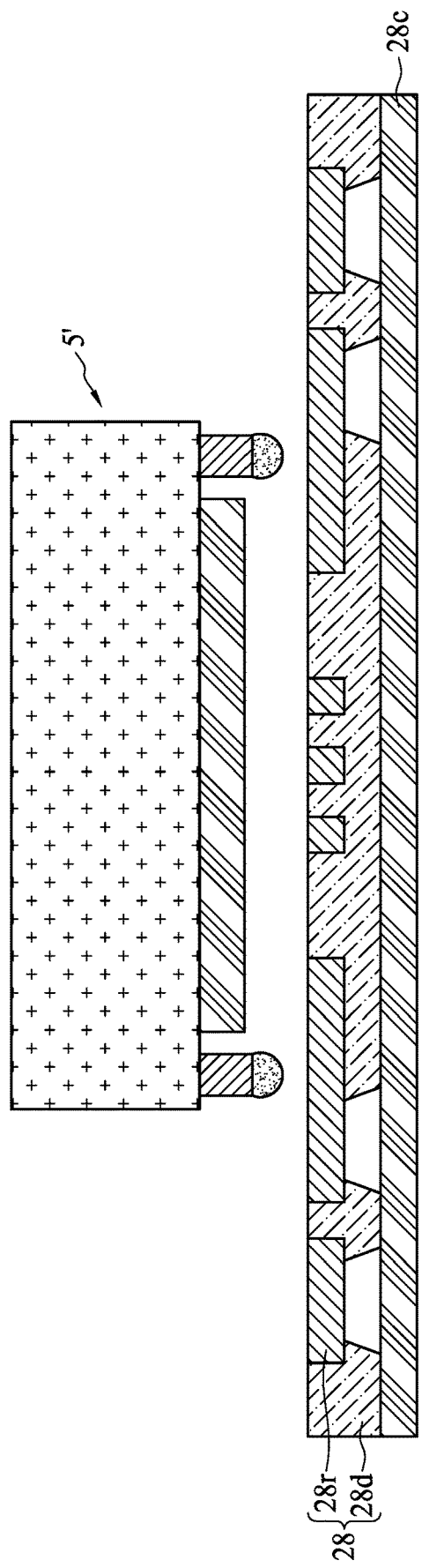
FIG. 5C illustrates various stage(s) of a method of manufacturing a semiconductor package in accordance with some embodiments of the present disclosure.

Referring to FIG. 5C, the semiconductor package device 5' is inverted and connected to a substrate 28. The substrate 28 is placed on a carrier 28c. The substrate 28 includes a dielectric layer 28d and a conductive patterned layer 28r. At least a portion of a top surface of the conductive patterned layer 28r is exposed from the dielectric layer 28d. The electrical contact 22c of the semiconductor package device 5' is disposed on the exposed portion of the top surface of the conductive patterned layer 28r.

Figure 5D:
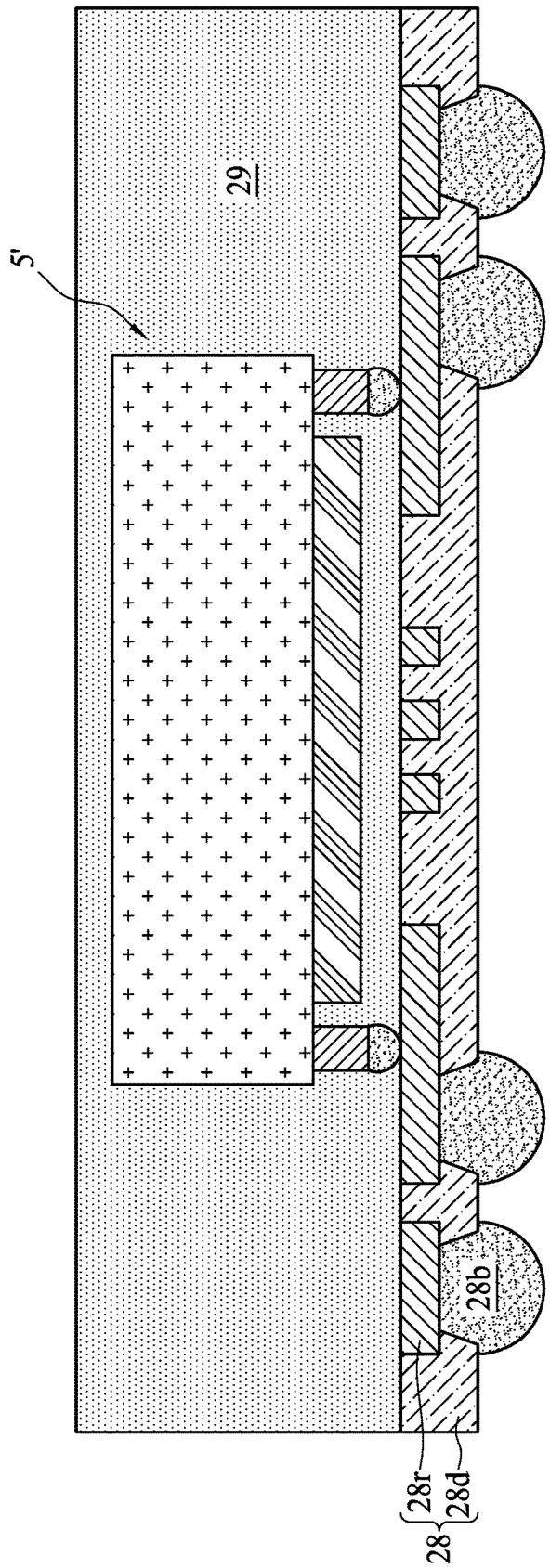
FIG. 5D illustrates various stage(s) of a method of manufacturing a semiconductor package in accordance with some embodiments of the present disclosure.

Referring to FIG. 5D, the carrier 28c is removed from the substrate 28. A package body 29 is formed on the substrate 28 to encapsulate or cover the semiconductor package device 5'. In some embodiments, the package body 29 includes an epoxy resin including fillers, a molding compound (e.g., an epoxy molding compound or other molding compound), a polyimide, a phenolic compound or material, a material including a silicone dispersed therein, or a combination of two or more thereof.

An electrical contact 28b is then formed or disposed on the conductive patterned layer 28d of the substrate 28 to form the semiconductor package device 5. In some embodiments, the semiconductor package device 5 is similar to the semiconductor package device 1H shown in FIG. 1H.

In some embodiments, the processes shown in FIGS. 5A, 5B, 5C and 5D are carried out in substrate level rather than wafer level. Therefore, a binding layer can be eliminated and the semiconductor package device 5' (including the circuit layer 20 and the MEMS device 21) can be connected to the substrate 28 without performing the process under wafer level, which may reduce the cost for manufacturing the semiconductor package device 5 having a fan-out structure.

Figure 6A:
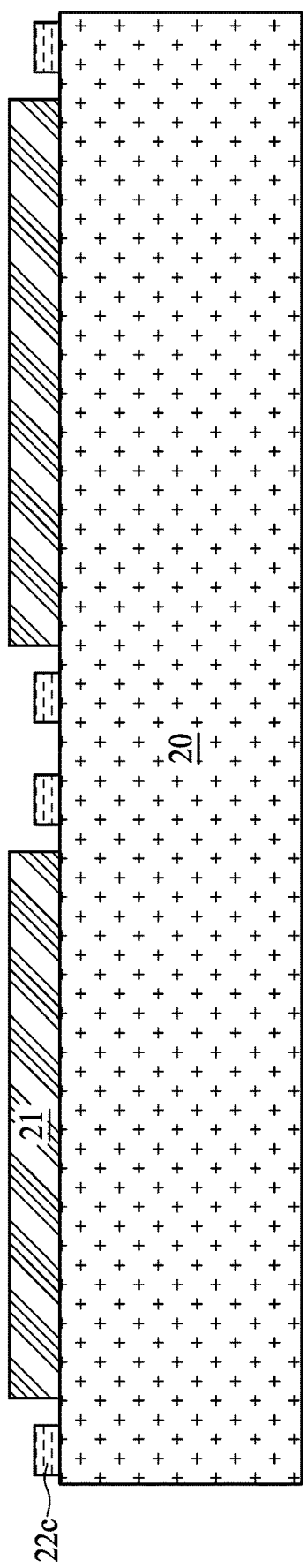
FIG. 6A illustrates various stage(s) of a method of manufacturing a semiconductor package in accordance with some embodiments of the present disclosure.
Figure 6B:
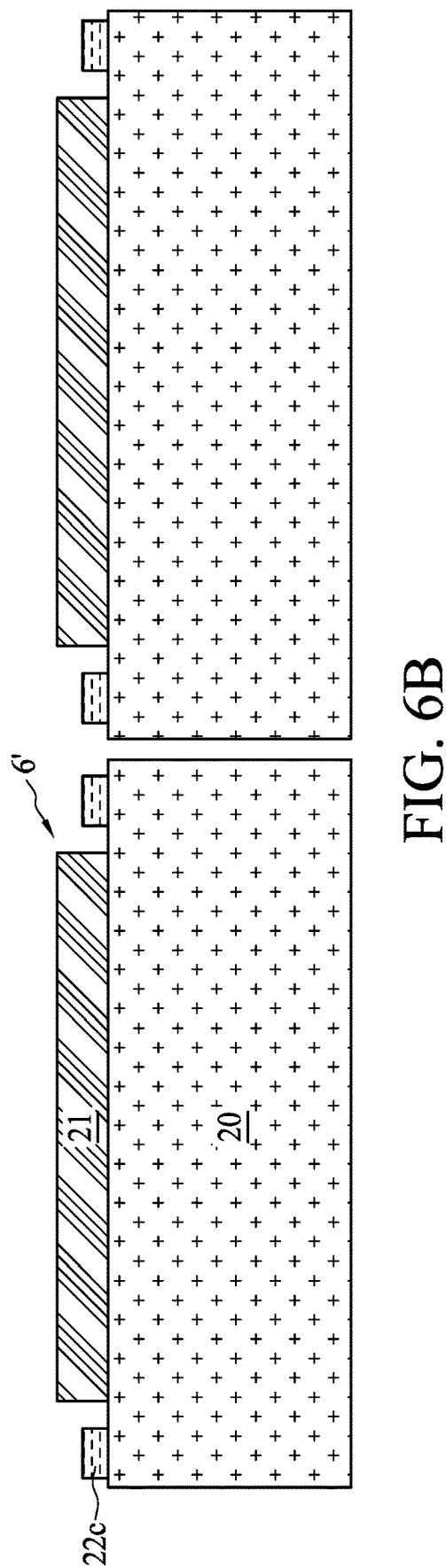
FIG. 6B illustrates various stage(s) of a method of manufacturing a semiconductor package in accordance with some embodiments of the present disclosure.
Figure 6C:
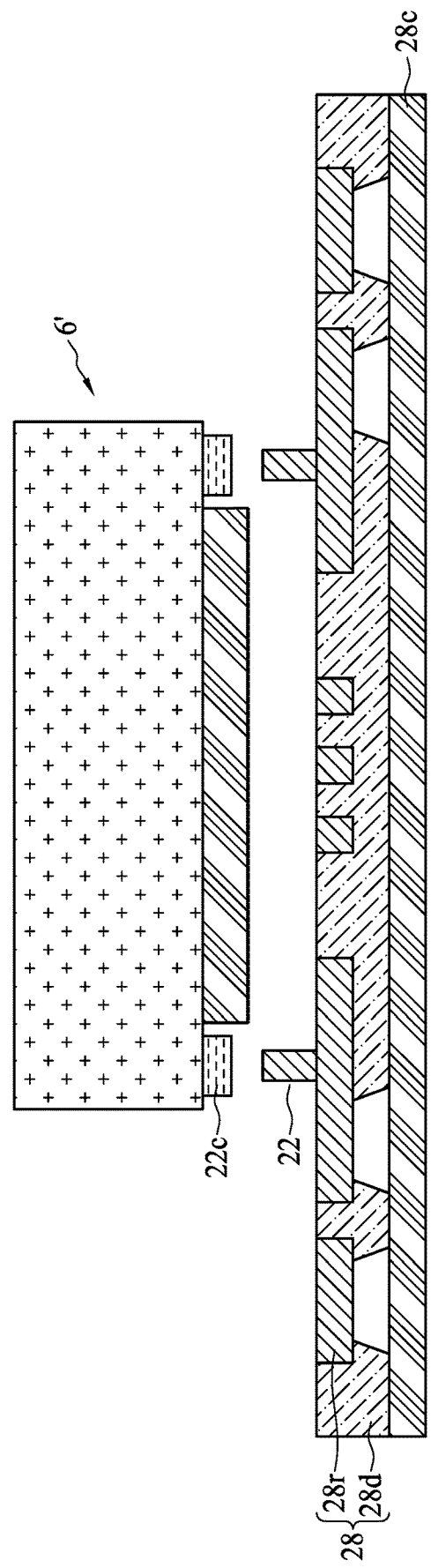
FIG. 6C illustrates various stage(s) of a method of manufacturing a semiconductor package in accordance with some embodiments of the present disclosure.

FIGS. 6A, 6B and 6C are cross-sectional views of a semiconductor structure fabricated at various stages, in accordance with some embodiments of the present disclosure. Various figures may have been simplified for a better understanding of the aspects of the present disclosure.

The operations shown in FIG. 6A are similar to those shown in FIG. 5A, except that the conductive contact 22c (instead of a conductive pillar) is formed on the circuit layer 20.

Referring to FIG. 6B, a singulation is performed to form the semiconductor package device 6'. For example, the singulation may be performed through the circuit layer 20. The singulation may be performed, for example, by using a dicing saw, laser or other appropriate cutting technique.

Referring to FIG. 6C, the semiconductor package device 6' is inverted and connected to conductive pillars 22 of the substrate 28. As shown in FIG. 6C, the conductive contacts 22c are aligned with the corresponding conductive pillars 22. The substrate 28 is placed on a carrier 28c. The substrate 28 includes a dielectric layer 28d and a conductive patterned layer 28r. At least a portion of a top surface of the conductive patterned layer 28r is exposed from the dielectric layer 28d. The electrical contact 22c of the semiconductor package device 5' is disposed on the exposed portion of the top surface of the conductive patterned layer 28r.

Figure 6D:
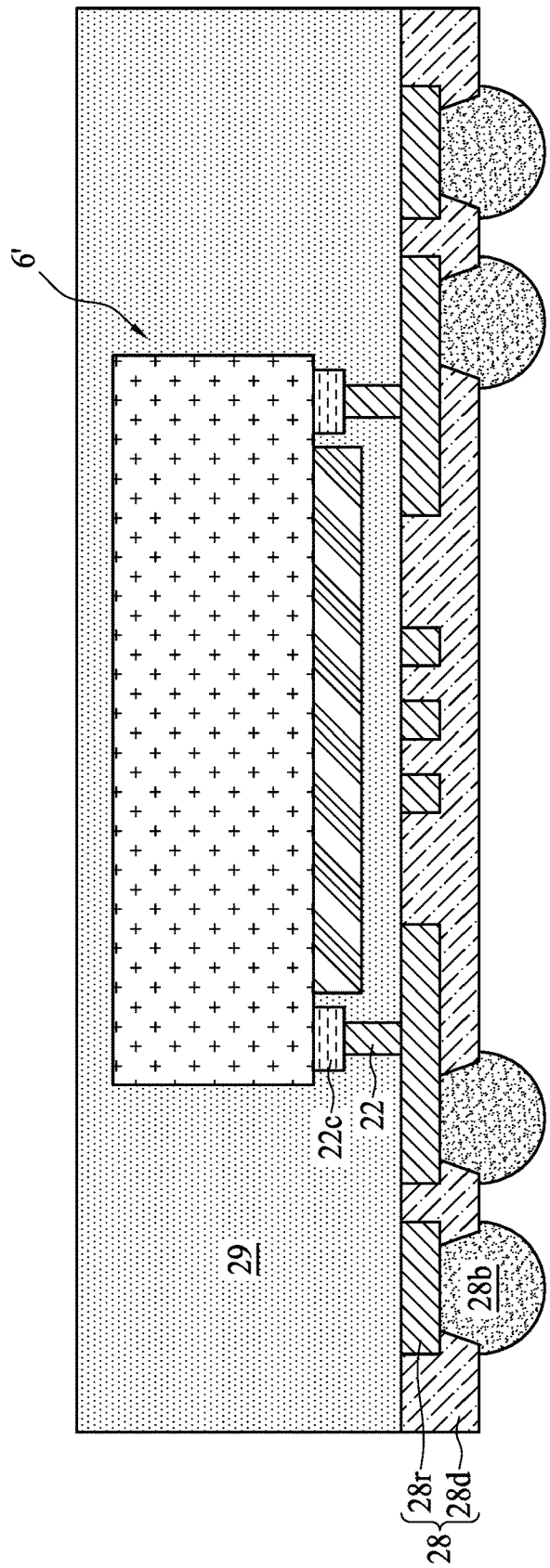
FIG. 6D illustrates various stage(s) of a method of manufacturing a semiconductor package in accordance with some embodiments of the present disclosure.

Referring to FIG. 6D, the carrier 28c is removed from the substrate 28. A package body 29 is formed on the substrate 28 to encapsulate or cover the semiconductor package device 6'. In some embodiments, the package body 29 includes an epoxy resin including fillers, a molding compound (e.g., an epoxy molding compound or other molding compound), a polyimide, a phenolic compound or material, a material including a silicone dispersed therein, or a combination of two or more thereof.

An electrical contact 28b is then formed or disposed on the conductive patterned layer 28r of the substrate 28 to form the semiconductor package device 6.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or "substantially" equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A micro-electromechanical systems (MEMS) package structure, comprising:
   a circuit layer;
   a MEMS die with an active surface, wherein the active surface faces the circuit layer;
   a conductive pillar adjacent to the MEMS die; and
   a package body encapsulating the MEMS die and the conductive pillar, and exposing a top surface of the conductive pillar; and a binding layer disposed on the package body and on the top surface of the conductive pillar, wherein a glass transition temperature (Tg) of the package body is greater than a temperature for forming the binding layer (Tc).

2. The MEMS package structure of claim 1, wherein the Tg of the package body is in a range from about 150° C. to about 195° C.

3. The MEMS package structure of claim 1, wherein the package body comprises a filler, and a content of the filler in the package body is greater than or equal to about 80% by mass.

4. The MEMS package structure of claim 1, wherein a sidewall of the conductive pillar directly contacts the package body.

5. The MEMS package structure of claim 1, wherein the conductive pillar comprises a first portion and a second portion on the first portion, and a thickness of the first portion is greater than a thickness of the second portion.

6. The MEMS package structure of claim 5, wherein the first portion of the conductive pillar and the second portion of the conductive pillar comprise different materials.

7. The MEMS package structure of claim 1, further comprising a redistribution layer (RDL) on the binding layer and electrically connected to at least a portion of the top surface of the conductive pillar that is exposed from the binding layer.

8. The MEMS package structure of claim 1, further comprising a conductive pad on the package body and electrically connected to an exposed portion of the top surface of the conductive pillar, wherein a portion of the conductive pad is exposed from the binding layer.

9. A micro-electromechanical systems (MEMS) package structure, comprising:
a MEMS die;
a conductive pillar adjacent to the MEMS die;
a package body encapsulating the MEMS die and the conductive pillar, and exposing a top surface of the conductive pillar; and
a binding layer disposed on the package body and on the top surface of the conductive pillar, wherein a glass transition temperature (Tg) of the package body is greater than a temperature for forming the binding layer (Tc).

10. The MEMS package structure of claim 9, further comprising a circuit layer on which the MEMS die and the conductive pillar are disposed, wherein the MEMS die is electrically connected to the circuit layer.

11. The MEMS package structure of claim 9, wherein the package body comprises a filler, and a content of the filler in the package body is greater than or equal to about 80% by mass.

12. The MEMS package structure of claim 9, wherein a sidewall of the conductive pillar directly contacts the package body.

13. The MEMS package structure of claim 9, wherein the conductive pillar comprises a first portion and a second portion on the first portion, and a thickness of the first portion is greater than a thickness of the second portion.

14. The MEMS package structure of claim 13, wherein the first portion of the conductive pillar and the second portion of the conductive pillar comprise different materials.

15. The MEMS package structure of claim 9, further comprising a redistribution layer (RDL) on the binding layer and electrically connected to at least a portion of the top surface of the conductive pillar that is exposed from the binding layer.

16. The MEMS package structure of claim 9, further comprising a conductive pad on the package body and electrically connected to an exposed portion of the top surface of the conductive pillar, wherein a portion of the conductive pad is exposed from the binding layer.

* * * * *